(12) United States Patent
Katagiri et al.

(10) Patent No.: US 7,681,154 B2
(45) Date of Patent: Mar. 16, 2010

(54) METHOD FOR DESIGNING DEVICE, SYSTEM FOR AIDING TO DESIGN DEVICE, AND COMPUTER PROGRAM PRODUCT THEREFOR

(75) Inventors: Mitsuaki Katagiri, Tokyo (JP); Satoshi Nakamura, Tokyo (JP); Takashi Suga, Tokyo (JP); Hiroya Shimizu, Tokyo (JP); Satoshi Isa, Tokyo (JP); Satoshi Itaya, Tokyo (JP); Yukitoshi Hirose, Tokyo (JP)

(73) Assignees: Elpida Memory, Inc., Tokyo (JP); Hitachi, Ltd., Tokyo (JP)

( * ) Notice: Subject to any disclaimer, the term of this patent is extended or adjusted under 35 U.S.C. 154(b) by 158 days.

(21) Appl. No.: 11/854,591

(22) Filed: Sep. 13, 2007

(65) Prior Publication Data

US 2008/0072194 A1     Mar. 20, 2008

(30) Foreign Application Priority Data

Sep. 14, 2006   (JP) .............................. 2006-250076

(51) Int. Cl.
G06F 9/45       (2006.01)
G06F 17/50      (2006.01)

(52) U.S. Cl. .............................................. 716/4; 716/5

(58) Field of Classification Search ................ 716/1–21
See application file for complete search history.

(56) References Cited

U.S. PATENT DOCUMENTS 6,370,678 B1 *  4/2002  Culler .......................... 716/18

(Continued)

FOREIGN PATENT DOCUMENTS

JP        05-014171        1/1993

(Continued)

OTHER PUBLICATIONS

Guo et al.; "Circuit Models for Power Bus Structures on Printed Circuit Boards Using a Hybrid Fem-Spice Method"; Aug. 2006; IEEE; All pages.*

(Continued)

*Primary Examiner*—Jack Chiang
*Assistant Examiner*—Suresh Memula
(74) *Attorney, Agent, or Firm*—Young & Thompson

(57) ABSTRACT

A method for designing a device that comprises a first semiconductor chip, a second semiconductor chip and an adjustment target is disclosed. The first semiconductor chip comprises an input pad, a first power supply pad and a first ground pad. The second semiconductor chip comprises an output pad coupled to the input pad. The adjustment target is connected to the first and the second semiconductor chips. A main target variable is calculated from an input circuit chip model, an output circuit chip model of the second semiconductor chip in frequency domain and a target impedance model of the adjustment target in frequency domain. The input circuit chip model is created by representing the first semiconductor chip in frequency domain in consideration of a first capacitor model between the input pad and the first power supply pad, a second capacitor model between the input pad and the first ground pad, and a chip internal capacitor model between the first power supply pad and the first ground pad. The main target variable is compared with a predetermined constraint represented in frequency domain to decide design guidelines for the adjustment target.

47 Claims, 18 Drawing Sheets

U.S. PATENT DOCUMENTS

| | | | | |
|---|---|---|---|---|
| 6,643,597 | B1 * | 11/2003 | Dunsmore | 702/104 |
| 6,937,971 | B1 * | 8/2005 | Smith et al. | 703/18 |
| 2003/0169121 | A1 * | 9/2003 | Grebenkemper | 333/12 |
| 2004/0083086 | A1 * | 4/2004 | Gravrok | 703/13 |
| 2004/0254775 | A1 * | 12/2004 | Muranyi | 703/16 |
| 2005/0096888 | A1 * | 5/2005 | Ismail | 703/2 |
| 2005/0149894 | A1 | 7/2005 | Shimazaki et al. | |
| 2007/0057380 | A1 * | 3/2007 | Katagiri et al. | 257/778 |
| 2007/0204251 | A1 * | 8/2007 | Katagiri et al. | 716/10 |
| 2007/0283299 | A1 * | 12/2007 | Carlsen et al. | 716/4 |

FOREIGN PATENT DOCUMENTS

| | | |
|---|---|---|
| JP | 11-220094 | 8/1999 |
| JP | 2004-54522 | 2/2004 |
| JP | 2005-196406 | 7/2005 |
| JP | 2007-265398 | 10/2007 |

OTHER PUBLICATIONS

Watanabe et al.; "Parallel-Distributed Time-Domain Circuit Simulation of Power Distribution Networks with Frequency-Dependent Parameters"; Jul. 2006; IEEE; All pages.*

Bjerregaard et al.; "A Survey of Research and Practices of Network-on-Chip"; Mar. 2006; ACM; All pages.*

Satoshi Nakamura et al, Development of Design Techniques for Semiconductor-Package By using DRAM Macro-Model of Power System.

* cited by examiner

METHOD FOR DESIGNING DEVICE, SYSTEM FOR AIDING TO DESIGN DEVICE, AND COMPUTER PROGRAM PRODUCT THEREFOR

BACKGROUND OF THE INVENTION

This invention relates to a designing method aiming power integrity of a semiconductor chip included in a device and to a design aid system and a computer program product in both of which the method is implemented.

In a semiconductor chip such as a dynamic random access memory (DRAM) chip, transient currents flow through a power supply pad and a ground pad of the semiconductor chip, for example, when an output driver of the semiconductor chip changes its output state, i.e. from high level to low level, or from low level to high level. The transient currents cause voltage fluctuations at the power supply pad and the ground pad.

If the above-mentioned voltage fluctuations exceed a certain level, the semiconductor chip fails to function properly. Therefore, a semiconductor package should be designed so that the above-mentioned voltage fluctuations do not exceed the voltage fluctuation limitation.

In order to verify whether voltage fluctuations are allowable, a transient analysis with a SPICE (Simulation Program with integrated Circuit Emphasis) model is conventionally carried out as disclosed in JP-A 2004-54522. When a user finds out as a result of the conventional transient analysis that a designed semiconductor package violates the voltage fluctuation limitation therefor, the user should carry out design modification such as layout modification on the previously-designed package and then carry out a transient analysis on a newly-designed package, again. Normally, the above-mentioned analysis and design modification is carried out multiple times by trial and error, in accordance with the conventional transient analysis, so that its design cycle needs long time.

JP-A 2005-196406 has proposed another approach. The disclosed approach includes an analysis not in time domain but in frequency domain; the analysis is carried out for a fine layout to be formed on a semiconductor chip. However, the disclosed analysis can be carried out for neither a semiconductor package that comprises an already-designed semiconductor chip nor a printed circuit board which the semiconductor package is mounted on.

SUMMARY OF THE INVENTION

It is an object of the present invention to provide a novel design method which can shorten a design cycle of a device even if the device comprises an already-designed semiconductor chip.

One aspect of the present invention provides a method for designing a device that comprises a first semiconductor chip, a second semiconductor chip and an adjustment target. The first semiconductor chip comprises an input pad, a first power supply pad and a first ground pad. The second semiconductor chip comprises an output pad coupled to the input pad. The adjustment target is connected to the first and the second semiconductor chips. A main target variable is calculated from an input circuit chip model, an output circuit chip model of the second semiconductor chip in frequency domain and a target impedance model of the adjustment target in frequency domain. The input circuit chip model is created by representing the first semiconductor chip in frequency domain in consideration of a first capacitor model between the input pad and the first power supply pad, a second capacitor model between the input pad and the first ground pad, and a chip internal capacitor model between the first power supply pad and the first ground pad. The main target variable is compared with a predetermined constraint represented in frequency domain to decide design guidelines for the adjustment target.

An appreciation of the objectives of the present invention and a more complete understanding of its structure may be had by studying the following description of the preferred embodiment and by referring to the accompanying drawings.

Figure 1:
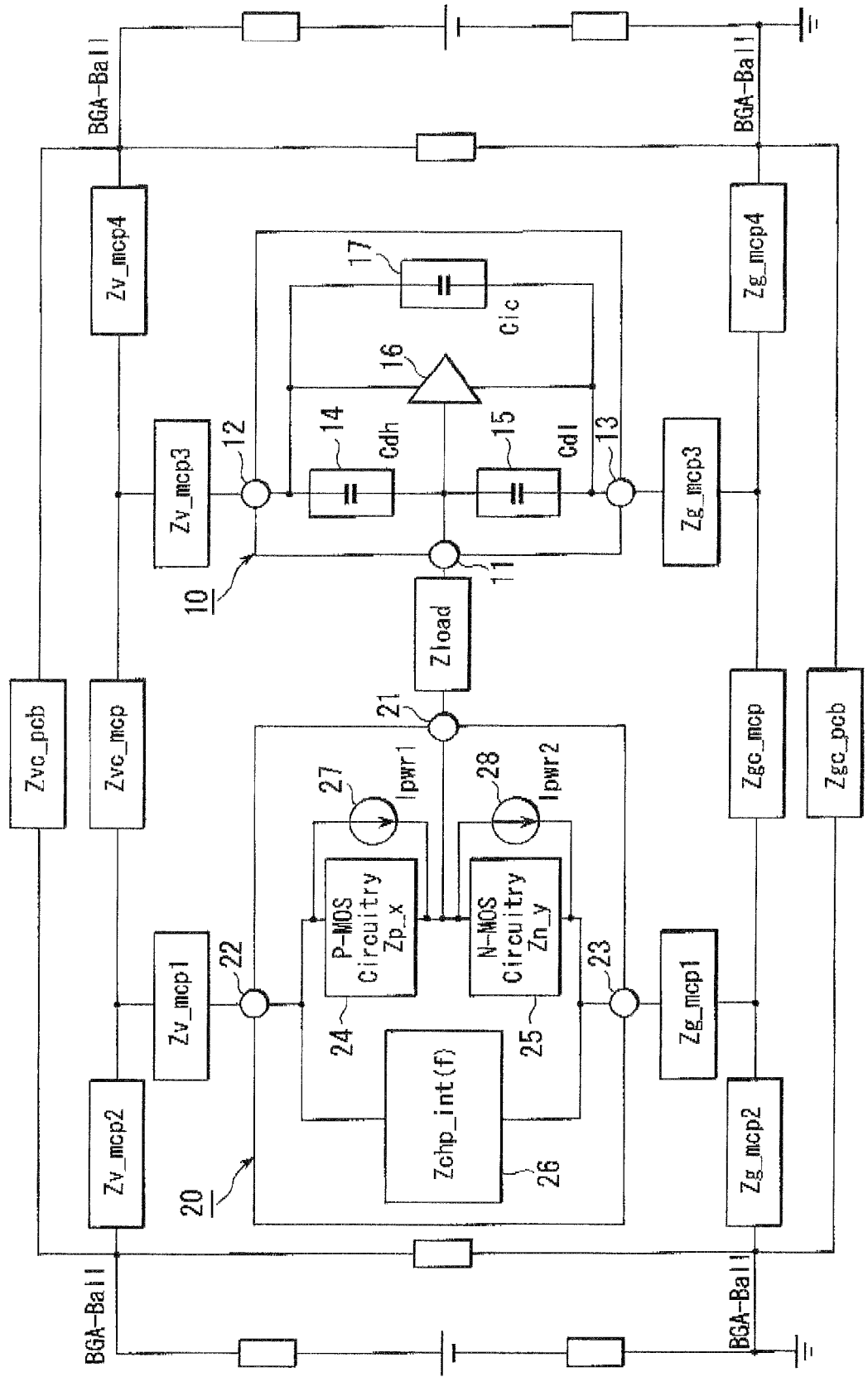
FIG. 1 is a view showing a semiconductor package which has an adjustment target on design in accordance with an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Explanation will be made about a case where a design method and analysis according to an embodiment of the present invention is applied for designing a device shown in FIG. 1.

The illustrated device of FIG. 1 is a model of a multi-chip package (MCP) mounted on a printed circuit board; however, this invention is not limited thereto but may be applicable to a system in a package (SiP) or a package on a package (PoP). The multi-chip package (MCP) comprises a first semiconductor chip 10 serving as an input circuit and a second semiconductor chip 20 serving as an output circuit. In this embodiment, the first semiconductor chip 10 is assumed as a controller chip including a processor and so on, and the second semiconductor chip 20 is assumed as a DRAM chip upon a read operation. Alternatively, the first semiconductor chip 10 may be assumed as a DRAM chip upon a write operation, and the second semiconductor chip 20 may be assumed as a controller chip.

The first semiconductor chip 10 comprises an input pad 11, a power supply pad 12 and a ground pad 13. The second semiconductor chip 20 comprises an output pad 21, a power supply pad 22 and a ground pad 23. The input pad 11 of the first semiconductor chip 10 is electrically connected to the output pad 21 of the second semiconductor chip 20. Although the first semiconductor chip 10 may be provided with two or more power supply pads 12 and two or more ground pads 13, the power supply pads 12 and the ground pads 13 are collectively handled as a single a single power supply pad 12 and a single ground pad 13, respectively. Likewise, the semiconductor chip 20 may be provided with two or more power supply pads 22 and two or more ground pads 23. In this connection, the first semiconductor chip 10 may have two or more input pads 11, while the second semiconductor chip 20 may have two or more output pads 21.

In FIG. 1, the illustrated symbol Zv_mcp1 shows an impedance of a wire connecting a bonding pad and the power supply pad 22, and the illustrated symbol Zv_mcp3 shows an impedance of a wire connecting a bonding pad and the power supply pad 12. The Zv_mcp2 shows an impedance between the bonding pad connected to the power supply pad 22 and a power supply package terminal (solder ball) for the first semiconductor chip 10. The Zv_mcp4 shows an impedance between the bonding pad connected to the power supply pad 12 and a power supply package terminal (solder ball) for the second semiconductor chip 20. The illustrated symbol Zvc_mcp collectively shows an impedance between the bonding pad for the power supply pad 22 and the bonding pad for the power supply pad 12. The illustrated symbol Zvc_pcb collectively shows an impedance of the printed circuit board, especially an impedance between the power supply package terminal (solder ball) for the first semiconductor chip 10 and the power supply package terminal (solder ball) for the second semiconductor chip 20.

Likewise, the illustrated symbol Zg_mcp1 shows an impedance of a wire connecting a bonding pad and the ground pad 23, and the illustrated symbol Zg_mcp3 shows an impedance of a wire connecting a bonding pad and the ground pad 13. The Zg_mcp2 shows an impedance between the bonding pad connected to the ground pad 23 and a ground package terminal (solder ball) for the first semiconductor chip 10. The Zg_mcp4 shows an impedance between the bonding pad connected to the ground pad 13 and a ground package terminal (solder ball) for the second semiconductor chip 20. The illustrated symbol Zgc_mcp collectively shows an impedance between the bonding pad for the ground pad 23 and the bonding pad for the ground pad 13. The illustrated symbol Zgc_pcb collectively shows an impedance of the printed circuit board, especially an impedance between the ground package terminal (solder ball) for the first semiconductor chip 10 and the ground package terminal (solder ball) for the second semiconductor chip 20.

As shown in FIG. 1, a capacitor model 14 is connected between the input pad 11 and the power supply pad 12, while another capacitor model 15 is connected between the input pad 11 and the ground pad 13. The illustrated capacitor model 14 is a model of an ESD (Electro Static Discharge) protection element for power supply, while the illustrated capacitor model 15 is another model of an ESD protection element for ground. If the first semiconductor chip 10 comprises a parasitic capacitor that has a relatively not-smaller capacitance between the input pad 11 and the power supply pad 12 in comparison with the ESD protection element for power supply, the capacitor model 14 may be assumed as a model of the combined capacitor of the parasitic capacitor and the ESD protection element for power supply. Likewise, if the first semiconductor chip 10 comprises a parasitic capacitor that has a relatively not-smaller capacitance between the input pad 11 and the ground pad 13 in comparison with the ESD protection element for ground, the capacitor model 15 may be assumed as a model of the combined capacitor of the parasitic capacitor and the ESD protection element for ground. The reference numeral 16 shows a pure function block of the input circuit of the first semiconductor chip 10. The reference numeral 17 shows a capacitor model that is a total model of capacitors intentionally-connected between the power supply pad 12 and the ground pad 13 and parasitic capacitors between the power supply pad 12 and the ground pad 13. In many products, the capacitor model 17 has a capacitance Cic that is greater than a capacitance Cdh of the capacitor model 14 or a capacitance Cdl of the capacitance model 15, by two or three orders of magnitude.

It is very important to consider the existence of the capacitor model 17 in order to obtain high precision results on simulation and analysis of the device of the present embodiment.

Figure 2:
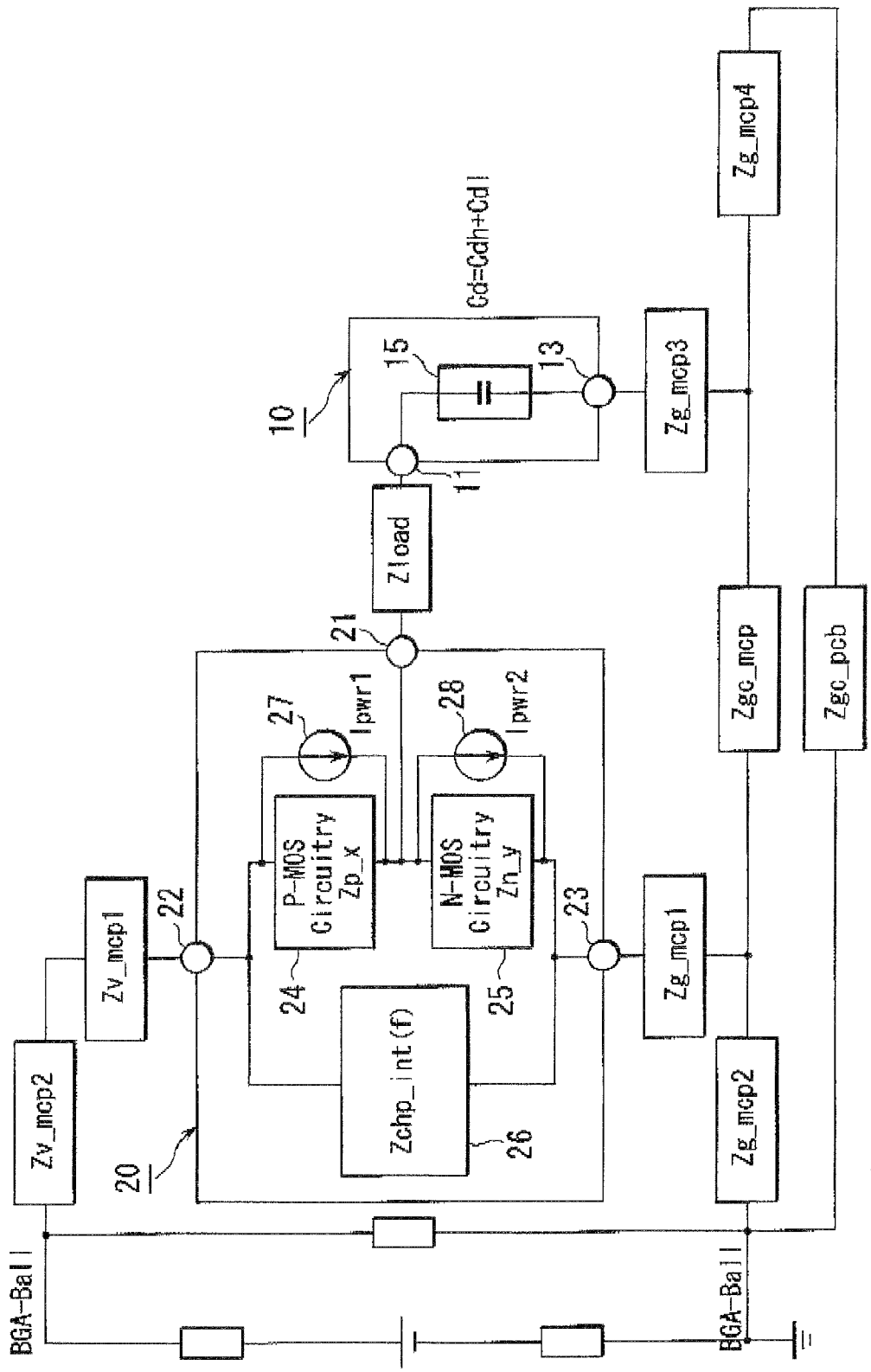
FIG. 2 is a view showing a general model of the semiconductor package of FIG. 1.

In addition, if each the impedance Zvc_mcp and the impedance Zvc_pcb is very larger than other impedance, a portion between the power supply pads 12, 22 in the MCP is assumed to electrically open, and another portion between the power supply pads 12, 22 in the printed circuit board is assumed to electrically open. As a matter of course, if the power supply pads 12, 22 are not connected to each other on the MCP/printed circuit board, a portion between the power supply pads 12, 22 in the MCP/printed circuit board is assumed to electrically open. If the existence of the capacitor model 17 is considered, a total load capacitance between the input pad 11 and the ground pad 13 can be represented as a capacitor model 18 that has a capacitance Cd (=Cdh+Cdl), i.e. a combined capacitance of the capacitor models 14, 15, as shown in FIG. 2. The illustrated model of FIG. 2 can provide high precision results with a small amount of calculation processes.

The model of FIG. 1 or the model of FIG. 2 may be selected depending upon whether the impedances Zvc_mcp and Zvc_pcb are very large. Alternatively, only the model of FIG. 2 may be used to decrease an amount of calculation processes. It is effective to use the model of FIG. 2, especially in case where design data of the semiconductor chip 10 is not available. In this case, a value actually measured between the input pad 11 and the ground pad 13 by means of probes may be used as the capacitance Cd of the capacitor model 18.

The illustrated second semiconductor chip 20 comprises a plurality of output drivers, each of which is normally constituted by a pMOS circuitry and an nMOS circuitry connected in series. The number of the output drivers in the actual DRAM chip comprises is equal to or more than the number of data lines (DQ lines). However, similar to the power supply pad 11 and the ground pad 12, the output drivers are collectively handled as a single driver, i.e. a single set of a pMOS circuitry and an nMOS circuitry, in the present embodiment. The illustrated symbol Zp_x shows an impedance of the pMOS circuitry of the output driver irrespective of the state of the pMOS circuitry. If the pMOS circuitry is in an ON state, its impedance is represented as Zp_on. On the other hand, if the pMOS circuitry is in an OFF state, its impedance is represented as Zp_off. Likewise, the illustrated symbol Zn_y shows an impedance of the nMOS circuitry of the output driver irrespective of the state of the nMOS circuitry. If the nMOS circuitry is in an ON state, its impedance is represented as Zn_on. On the other hand, if the pMOS circuitry is in an OFF state, its impedance is represented as Zn_off.

As shown in FIGS. 1 and 2, the second semiconductor chip 20 further comprises an internal section 26 which has an internal impedance Zchp_int(f). The internal impedance Zchp_int(f) is a total impedance of components of the second semiconductor chip 20 other than the output driver as seen between the power supply pad 22 and the ground pad 23 from the output driver.

According to the method of this embodiment, the above-mentioned chip model of the first semiconductor chip 10 and an impedance model of wires or traces of the package and/or the printed circuit board are coupled with another chip model of the second semiconductor chip 20 to calculate voltage fluctuations on the power supply pad 22 and/or the ground pad 23; the calculated voltage fluctuations are compared with a constraint predetermined in frequency domain to judge whether the calculated voltage fluctuations be allowable. Hereinafter, The circuit components such as wires or traces of the package and/or the printed circuit board are collectively referred to as an adjustment target, and its impedance model is referred to as a target impedance model.

In this embodiment, different four chip models are prepared for the second semiconductor chip 20, with reference to FIGS. 3 to 6.

Figure 3:
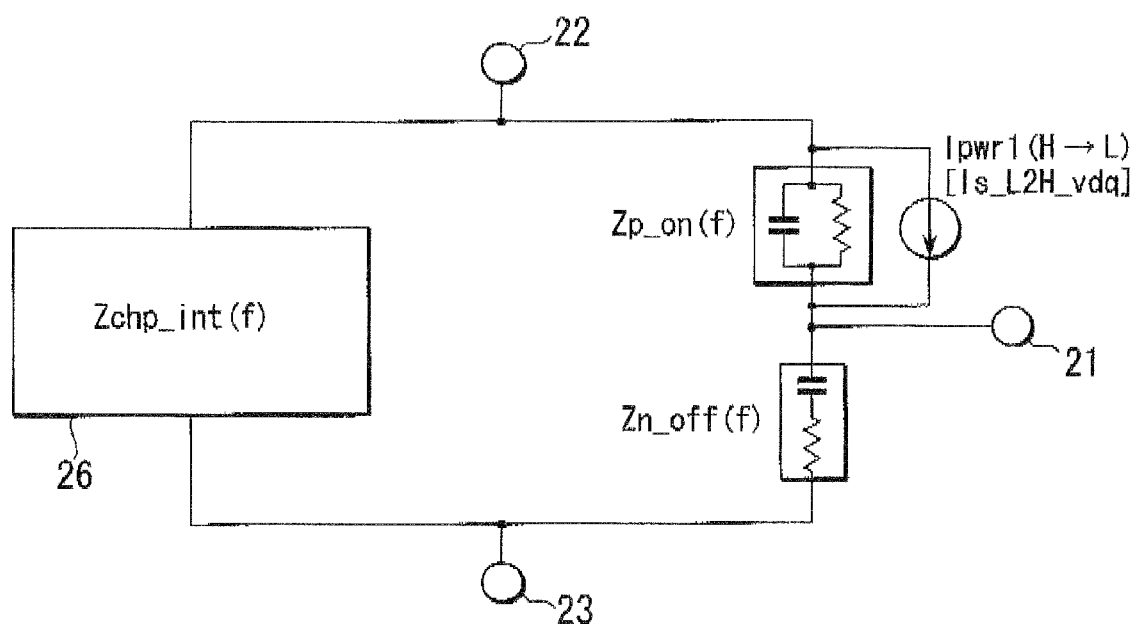
FIG. 3 is a view showing a first chip model for power supply voltage fluctuation.

FIG. 3 shows a first output circuit chip model that is created by representing the second semiconductor chip 20 in frequency domain in consideration of a first transition state, wherein the first transition state is a state where an output level of the second semiconductor chip 20 changes from its low level to its high level (L->H). The illustrated first output circuit chip model is used in analysis of voltage fluctuation on the power supply pad 22 and is created by connecting a pMOS circuitry impedance Zp_on(f) and a current source Ipwr1 in parallel between the output pad 21 and the power supply pad 22, by connecting an nMOS circuitry impedance Zn_off(f) between the output pad 21 and the ground pad 23, and by connecting the internal impedance Zchp_int(f) between the power supply pad 22 and the ground pad 23. In this analysis, the pMOS circuitry impedance Zp_on(f) is an impedance of the pMOS circuitry of an ON state, while the nMOS circuitry impedance Zn_off(f) is an impedance of the nMOS circuitry of an OFF state. The current source Ipwr1 is assumed on the basis of current fluctuation on the power supply pad 22 in the first transition state (L->H), and its current value is represented as "Is_L2H_vdq"; how to assume the current source Ipwr1 is explained in detail afterwards.

Figure 4:
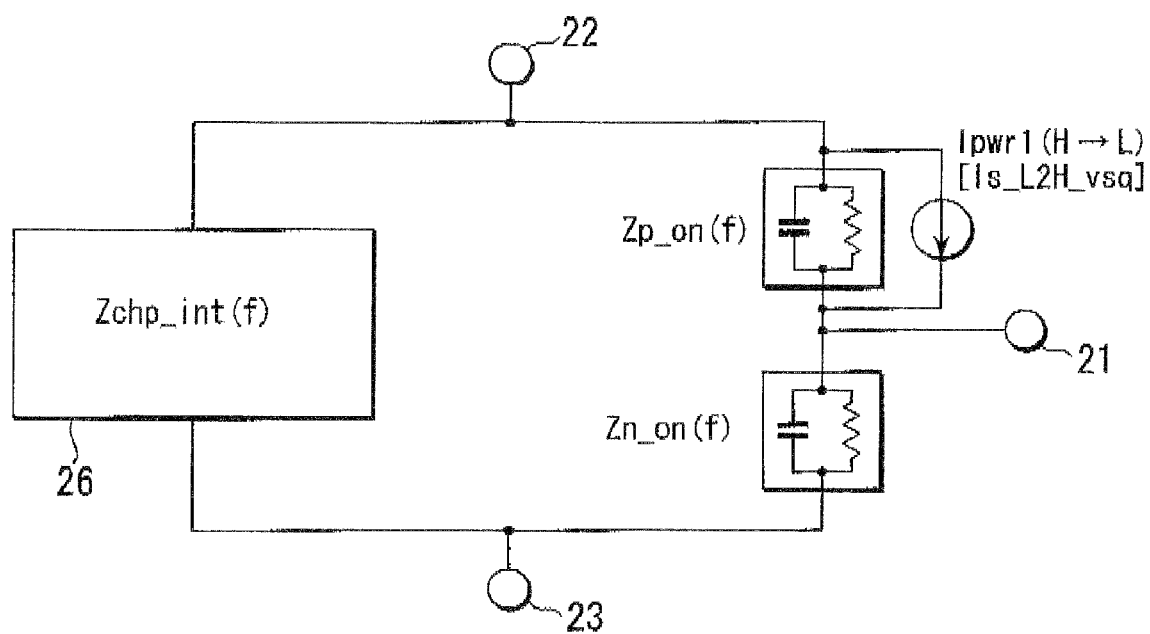
FIG. 4 is a view showing a first chip model for ground voltage fluctuation.

FIG. 4 shows another first output circuit chip model that is created by representing the second semiconductor chip 20 in frequency domain in consideration of the first transition state (L->H). The illustrated first output circuit chip model is used in analysis of voltage fluctuation not on the power supply pad 22 but on the ground pad 23 and is created by connecting a pMOS circuitry impedance Zp_on(f) and a current source Ipwr1 in parallel between the output pad 21 and the power supply pad 22, by connecting an nMOS circuitry impedance Zn_on(f) between the output pad 21 and the ground pad 23, and by connecting the internal impedance Zchp_int(f) between the power supply pad 22 and the ground pad 23. In this analysis, the pMOS circuitry impedance Zp_on(f) is an impedance of the pMOS circuitry of an ON state, while the nMOS circuitry impedance Zn_on(f) is an impedance of the nMOS circuitry of an ON state. The current source Ipwr1 is assumed on the basis of current fluctuation on the ground pad 23 in the first transition state (L->H), and its current value is represented as "Is_L2H_vsq"; how to assume the current source Ipwr1 is explained in detail afterwards.

Figure 5:
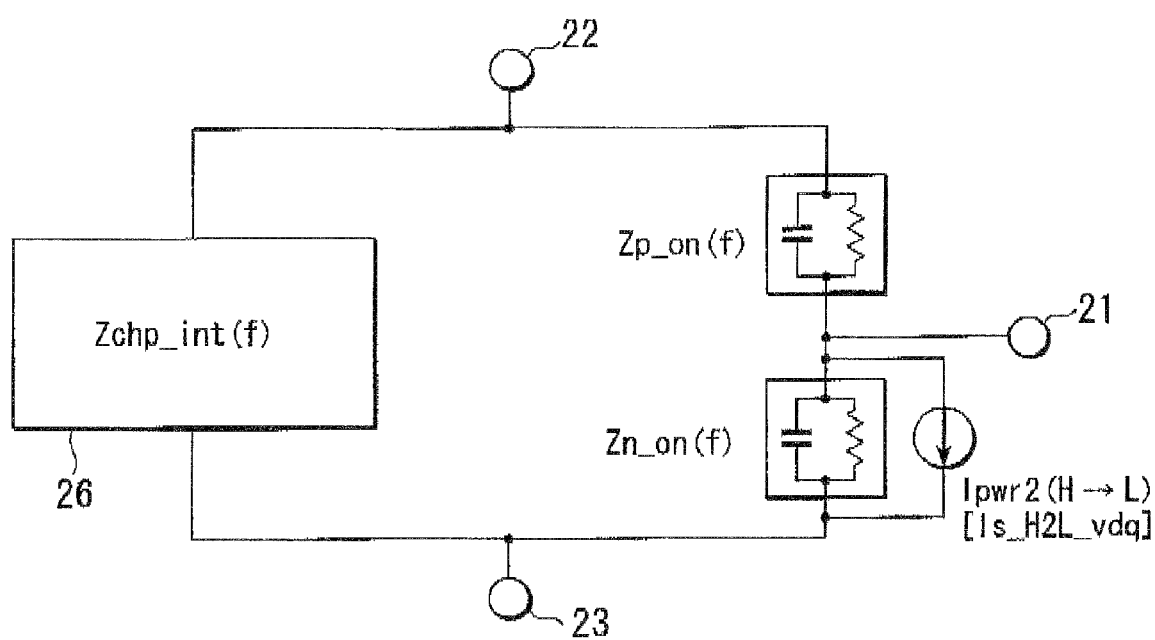
FIG. 5 is a view showing a second chip model for power supply voltage fluctuation.

FIG. 5 shows a second output circuit chip model that is created by representing the second semiconductor chip 20 in frequency domain in consideration of a second transition state, wherein the second transition state is a state where an output level of the second semiconductor chip 20 changes from its high level to its low level (H->L). The illustrated second output circuit chip model is used in analysis of voltage fluctuation on the power supply pad 22 and is created by connecting a pMOS circuitry impedance Zp_on(f) between the output pad 21 and the power supply pad 22, by connecting an nMOS circuitry impedance Zn_on(f) and a current source Ipwr2 in parallel between the output pad 21 and the ground pad 23, and by connecting the internal impedance Zchp_int(f) between the power supply pad 22 and the ground pad 23. In this analysis, the pMOS circuitry impedance Zp_on(f) is an impedance of the pMOS circuitry of an ON state, while the nMOS circuitry impedance Zn_on(f) is an impedance of the nMOS circuitry of an ON state. The current source Ipwr2 is assumed on the basis of current fluctuation on the power supply pad 22 in the second transition state (H->L), and its current value is represented as "Is_H2L_vdq"; how to assume the current source Ipwr2 is explained in detail afterwards.

Figure 6:
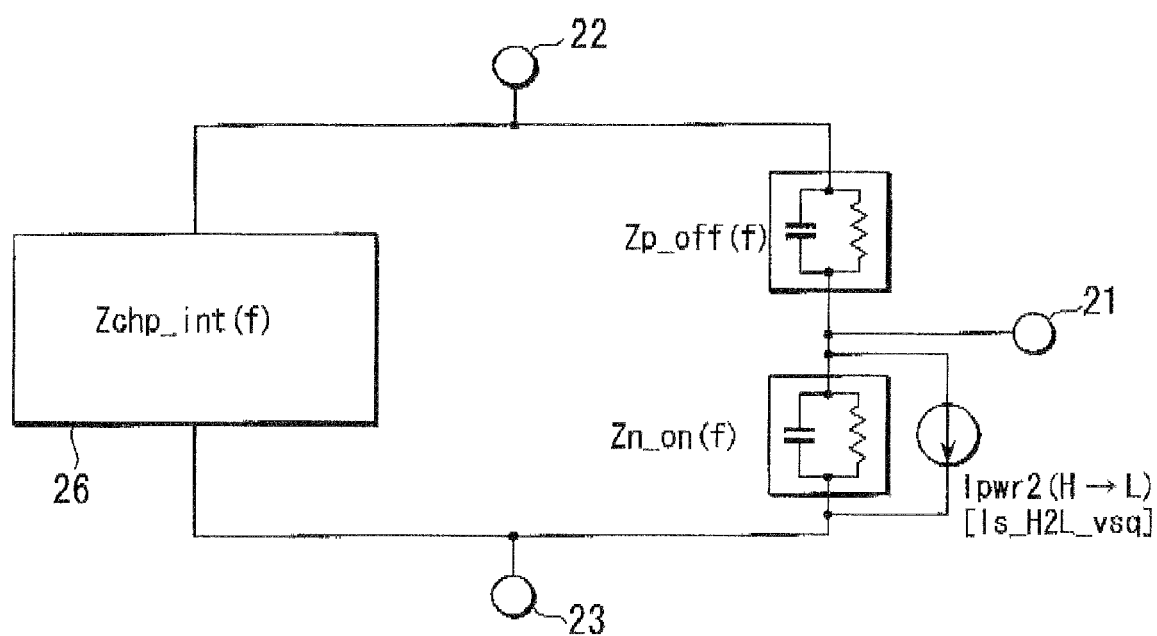
FIG. 6 is a view showing a second chip model for ground voltage fluctuation.

FIG. 6 shows another second output circuit chip model that is created by representing the second semiconductor chip 20 in frequency domain in consideration of the second transition state (H->L). The illustrated second output circuit chip model is used in analysis of voltage fluctuation not on the power supply pad 22 but on the ground pad 23 and is created by connecting a pMOS circuitry impedance Zp_off(f) between output pad 21 and the power supply pad 22, by connecting an nMOS circuitry impedance Zn_on(f) and a current source Ipwr2 in parallel between the output pad 21 and the ground pad 23, and by connecting the internal impedance Zchp_int(f) between the power supply pad 22 and the ground pad 23. In this analysis, the pMOS circuitry impedance Zp_off(f) is an impedance of the pMOS circuitry of an OFF state, while the nMOS circuitry impedance Zn_on(f) is an impedance of the nMOS circuitry of an ON state. The current source Ipwr2 is assumed on the basis of current fluctuation on the ground pad 23 in the second transition state (H->L), and its current value is represented as "Is_H2L_vsq"; how to assume the current source Ipwr2 is explained in detail afterwards.

Next explanation will be made about the method of the present embodiment including the way to create the above-mentioned chip models, with reference also to FIGS. 7 to 16.

Figure 7:
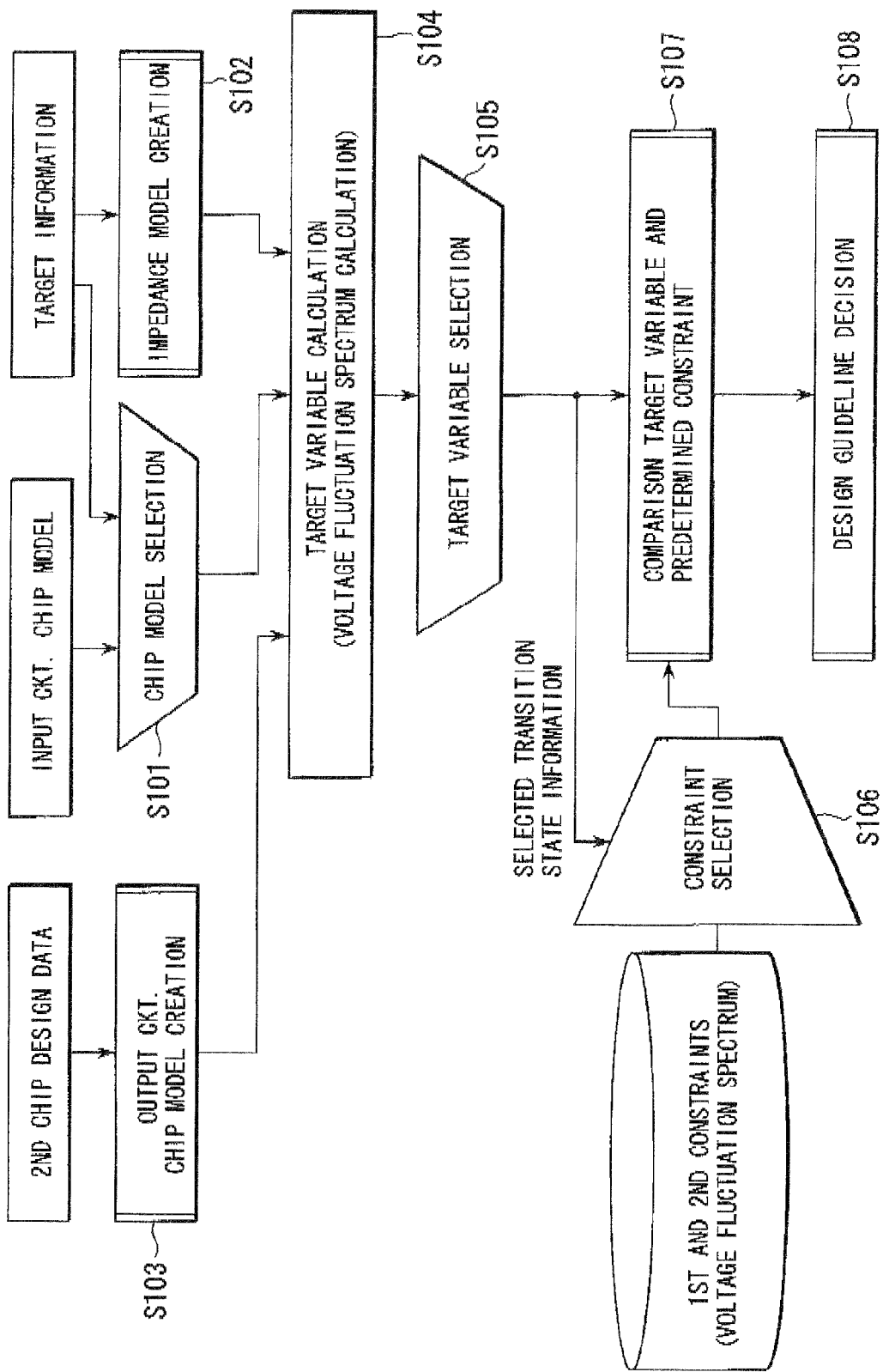
FIG. 7 is a flowchart showing a design method in accordance with an embodiment of the present invention.

With reference to FIG. 7, any one of first and second input circuit chip models is selected as the input circuit chip model, on the basis of target information about the adjustment target (S101), wherein the first input circuit chip model is of FIG. 1, while the second input circuit chip model is of FIG. 2. The target impedance model shown in FIG. 1 or 2 is created on the basis of the target information (S102).

As shown in FIG. 7, the first output circuit chip model and the second output circuit chip model are created on the basis of chip information such as chip design data about the second semiconductor chip 20 (S103). The chip model creation (S103) is carried out as follows.

Figure 8:
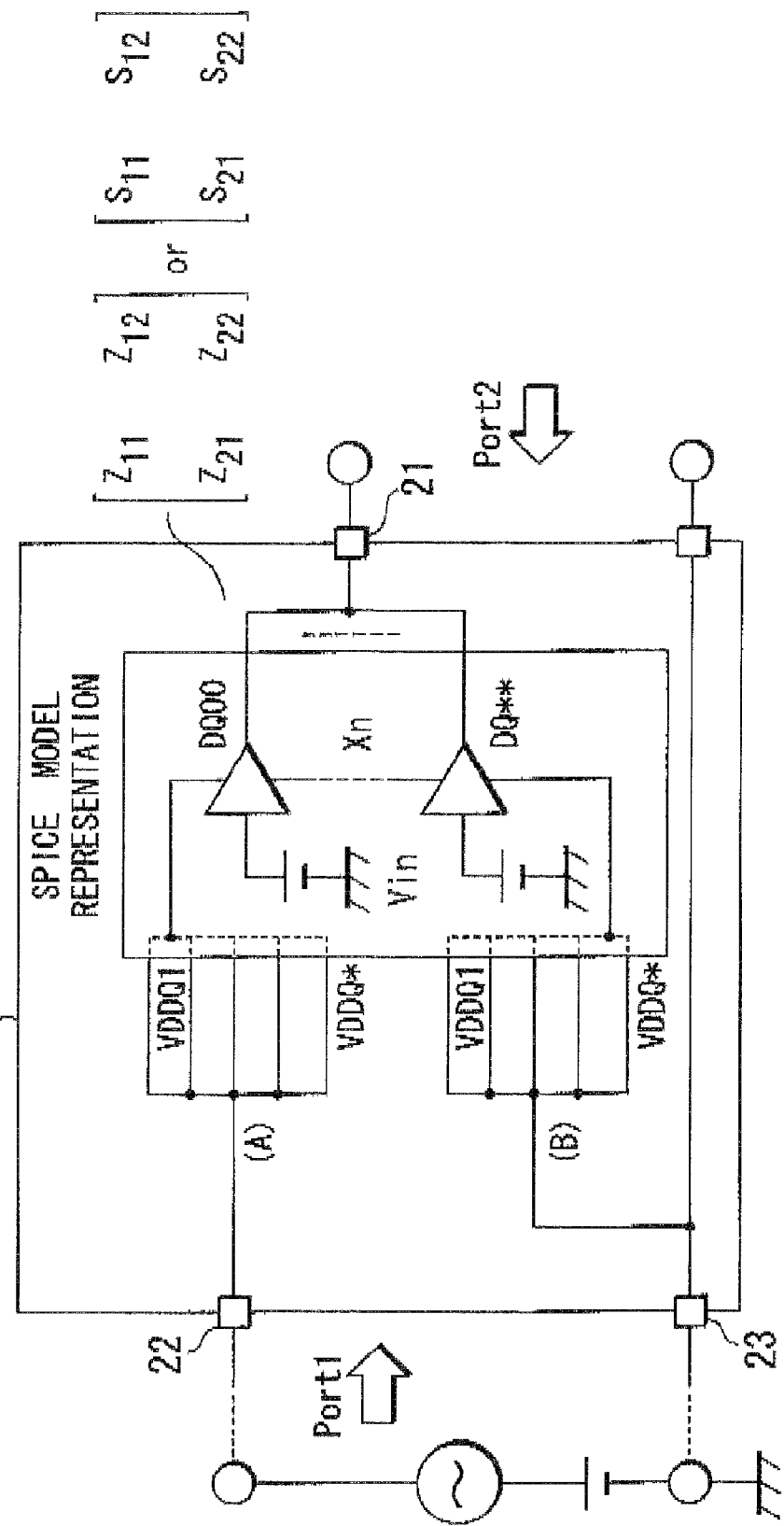
FIG. 8 is a view for use in describing how to decide impedances of the first and the second chip models.

As shown in FIG. 8, an AC analysis is carried out about a SPICE model of the second semiconductor chip 20 to calculate Z parameters of the second semiconductor chip 20. Although the Z parameters are directly calculated from the AC analysis in this embodiment, S parameters of the second semiconductor chip 20 may be calculated at first and be then transformed into the Z parameters. In addition, the Z parameters may be obtained by actual measurements without using the above-mentioned SPICE model.

Figure 9:
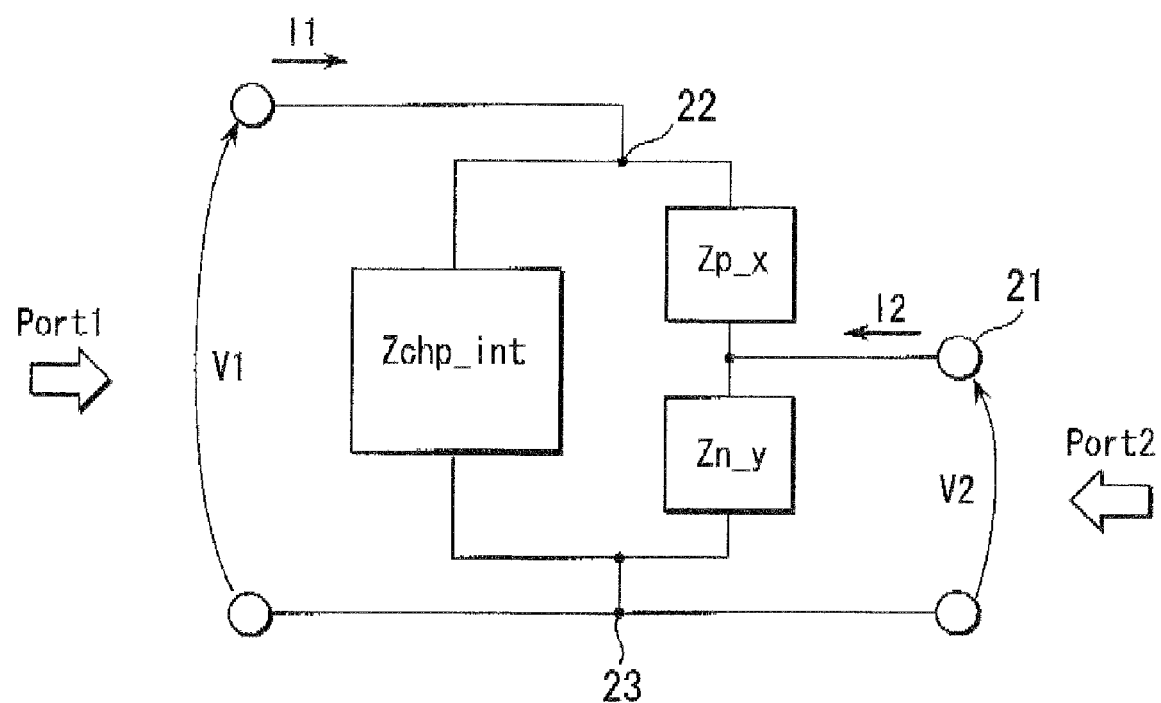
FIG. 9 is another view for use in describing how to decide impedances of the first and the second chip models.
Figure 10:
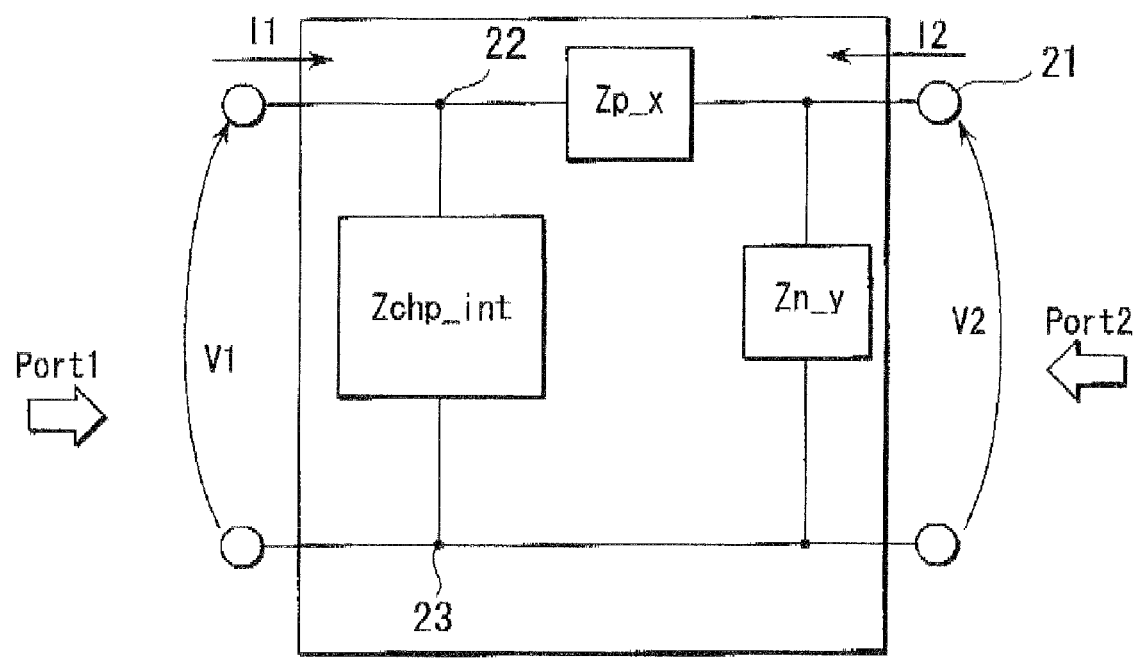
FIG. 10 is another view for use in describing how to decide impedances of the first and the second chip models.

FIG. 9 shows components of the chip model relating to impedances which constitute a two-port network. For the sake of easy understanding, the two-port network of FIG. 9 is transformed into that of FIG. 10. The Z parameters of the two-port network are represented as a following determinant:

$$\begin{bmatrix} V_1 \\ V_2 \end{bmatrix} = \begin{bmatrix} Z_{11} & Z_{12} \\ Z_{21} & Z_{22} \end{bmatrix} \begin{bmatrix} I_1 \\ I_2 \end{bmatrix} \quad (1)$$

$$= \begin{bmatrix} \dfrac{Z_{chp\_int} \times (Z_{p\_x} + Z_{n\_y})}{Z_{chp\_int} + (Z_{p\_x} + Z_{n\_y})} & \dfrac{Z_{chp\_int} \times Z_{n\_y}}{(Z_{chp\_int} + Z_{p\_x}) + Z_{n\_y}} \\ \dfrac{Z_{chp\_int} \times Z_{n\_y}}{Z_{chp\_int} + (Z_{p\_x} + Z_{n\_y})} & \dfrac{(Z_{chp\_int} + Z_{p\_x}) \times Z_{n\_y})}{(Z_{chp\_int} + Z_{p\_x}) + Z_{n\_y}} \end{bmatrix} \begin{bmatrix} I_1 \\ I_2 \end{bmatrix}$$

Solving the above determinant (1), impedances $Z_{p\_x}$, $Z_{n\_y}$ and $Z_{chp\_int}$ are represented as following equations.

$$Z_{p\_x} = \frac{Z_{11} \cdot Z_{22}}{Z_{12}} - Z_{12} \quad (2)$$

$$Z_{n\_y} = \frac{Z_{11} \cdot Z_{22} - Z_{12}^2}{Z_{11} - Z_{12}} \quad (3)$$

$$Z_{chp\_int} = \frac{Z_{11} \cdot Z_{22} - Z_{12}^2}{Z_{22} - Z_{12}} \quad (4)$$

As apparent from the above equations (2) and (3), impedances $Z_{p\_on}$ and $Z_{n\_off}$ can be calculated by using impedances $Z_{11}$, $Z_{12}$ and $Z_{22}$ for the case where an output level of the output driver is high. Likewise, impedances $Z_{p\_off}$ and $Z_{n\_on}$ can be calculated by using impedances $Z_{11}$, $Z_{12}$ and $Z_{22}$ for the case where an output level of the output driver is low.

After the calculation of the impedances $Z_{p\_on}$, $Z_{p\_off}$, $Z_{n\_on}$ and $Z_{n\_off}$, current sources Ipwr1 and Ipwr2 are assumed as shown in FIGS. 11 to 14.

Figure 11:
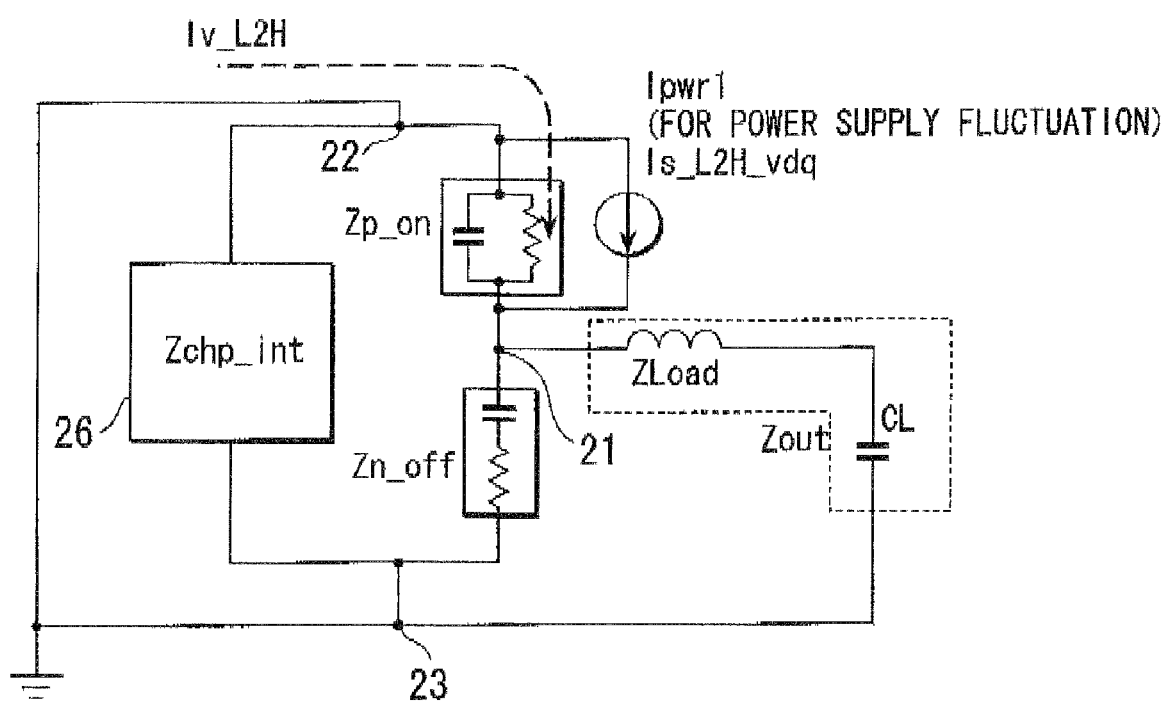
FIG. 11 is a view for use in describing how to calculate a first current source for power supply voltage fluctuation spectrum calculation.

With reference to FIG. 11, in order to calculate the current source Ipwr1 for use in analysis of power supply voltage fluctuation, a predetermined load model Zload is connected between the output pad 21 and the ground pad 23. The predetermined load model Zout is created by connecting an inductance Zload of a wire between the output pad 21 and the input pad 11 with a capacitance CL between the input pad 11 and the ground pad 13; the capacitance CL is equal to the capacitance Cd of the capacitor model 18 in this embodiment. If the predetermined load model Zout is extremely smaller than the nMOS circuitry impedance $Z_{n\_off}$, a current Iv_L2H passing through the power supply pad 22 in the first transition state (L->H) generally flows into the pMOS circuitry impedance $Z_{p\_on}$ and the predetermined load model Zout. In this embodiment, the current Iv_L2H is represented in frequency domain and is obtained by carrying out a transient analysis with a SPICE model of the second semiconductor chip 20, followed by carrying out the Fourier transform for the result of the transient analysis. By using the current Iv_L2H, the current value Is_L2H_vdq of the current source Ipwr1 can be calculated from the following equation:

$$I_{s\_L2H\_vdq} = \frac{Z_{p\_on} + Z_{n\_off} // Z_{load}}{Z_{p\_on}} \times I_{v\_L2H} \quad (5)$$

Figure 12:
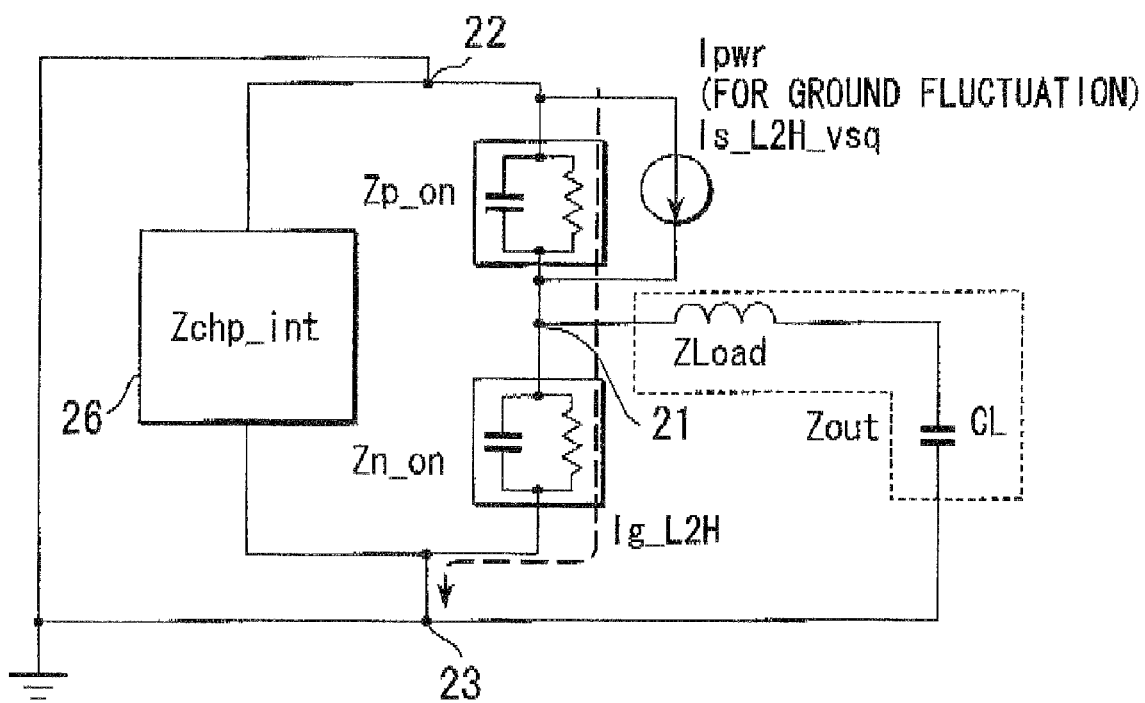
FIG. 12 is a view for use in describing how to calculate a first current source for ground voltage fluctuation spectrum calculation.

Likewise, in order to calculate the current source Ipwr1 for use in analysis of ground voltage fluctuation, the predetermined load model Zout is connected between the output pad 21 and the ground pad 23, as shown in FIG. 12. If the predetermined load model Zout is extremely larger than the nMOS circuitry impedance $Z_{n\_on}$, a current Ig_L2H passing through the ground pad 23 in the first transition state (L->H) generally flows into the pMOS circuitry impedance $Z_{p\_on}$ and the nMOS circuitry impedance $Z_{n\_on}$. In this embodiment, the current Ig_L2H is represented in frequency domain and is obtained by carrying out a transient analysis with a SPICE model of the second semiconductor chip 20, followed by carrying out the Fourier transform for the result of the transient analysis. By using the current Ig_L2H, the current value Is_L2H_vsq of the current source Ipwr1 can be calculated from the following equation:

$$I_{s\_L2H\_vsq} = \frac{Z_{p\_on} + Z_{n\_on} // Z_{load}}{Z_{p\_on}} \cdot \frac{Z_{n\_on}}{Z_{n\_on} // Z_{load}} \times I_{g\_L2H} \quad (6)$$

Figure 13:
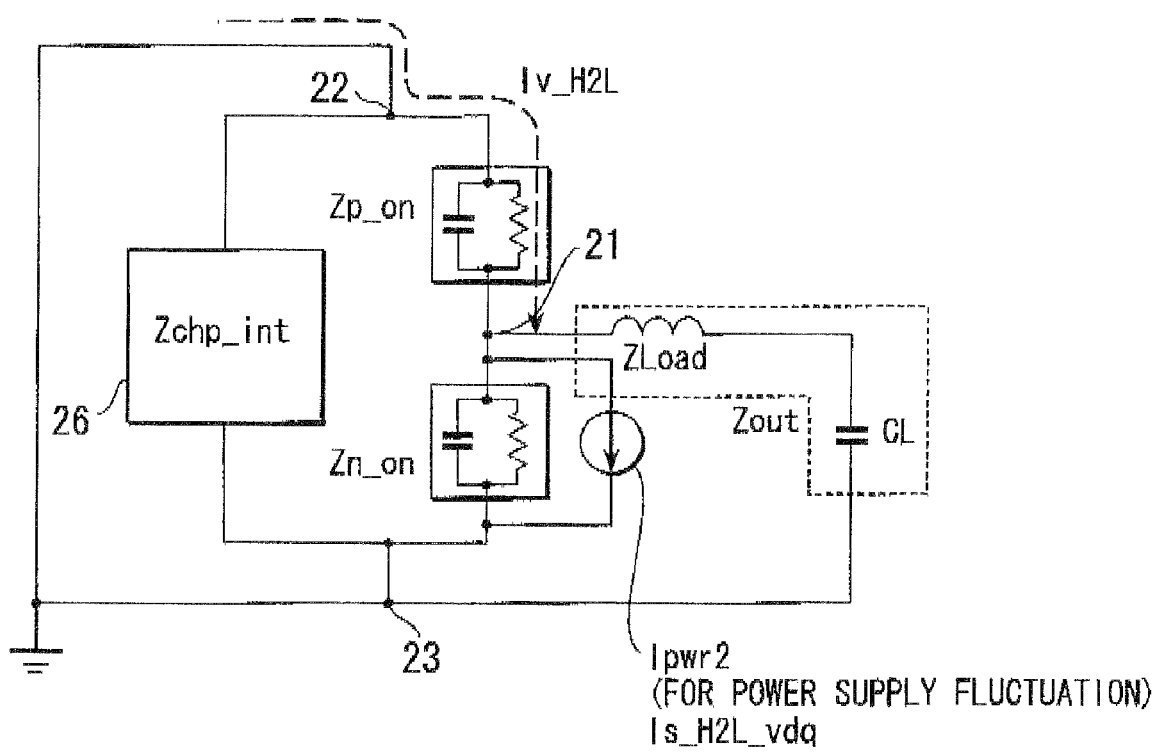
FIG. 13 is a view for use in describing how to calculate a second current source for power supply voltage fluctuation spectrum calculation.

On the other hand, in order to calculate the current source Ipwr2 for use in analysis of power supply voltage fluctuation, the predetermined load model Zout is connected between the output pad 21 and the ground pad 23, as shown in FIG. 13. If the predetermined load model Zout is extremely larger than the nMOS circuitry impedance $Z_{n\_on}$, a current Iv_H2L passing through the power supply pad 22 in the second transition state (H->L) generally flows into the pMOS circuitry impedance $Z_{p\_on}$ and the nMOS circuitry impedance $Z_{n\_on}$. In this embodiment, the current Iv_H2L is represented in frequency domain and is obtained by carrying out a transient analysis with a SPICE model of the second semiconductor chip 20, followed by carrying out the Fourier transform for the result of the transient analysis. By using the current Iv_H2L, the current value Is_H2L_vdq of the current source Ipwr2 can be calculated from the following equation:

$$I_{s\_H2L\_vdq} = \frac{Z_{n\_on} + Z_{p\_on} // Z_{load}}{Z_{n\_on}} \cdot \frac{Z_{p\_on}}{Z_{p\_on} // Z_{load}} \times I_{v\_H2L} \quad (7)$$

Figure 14:
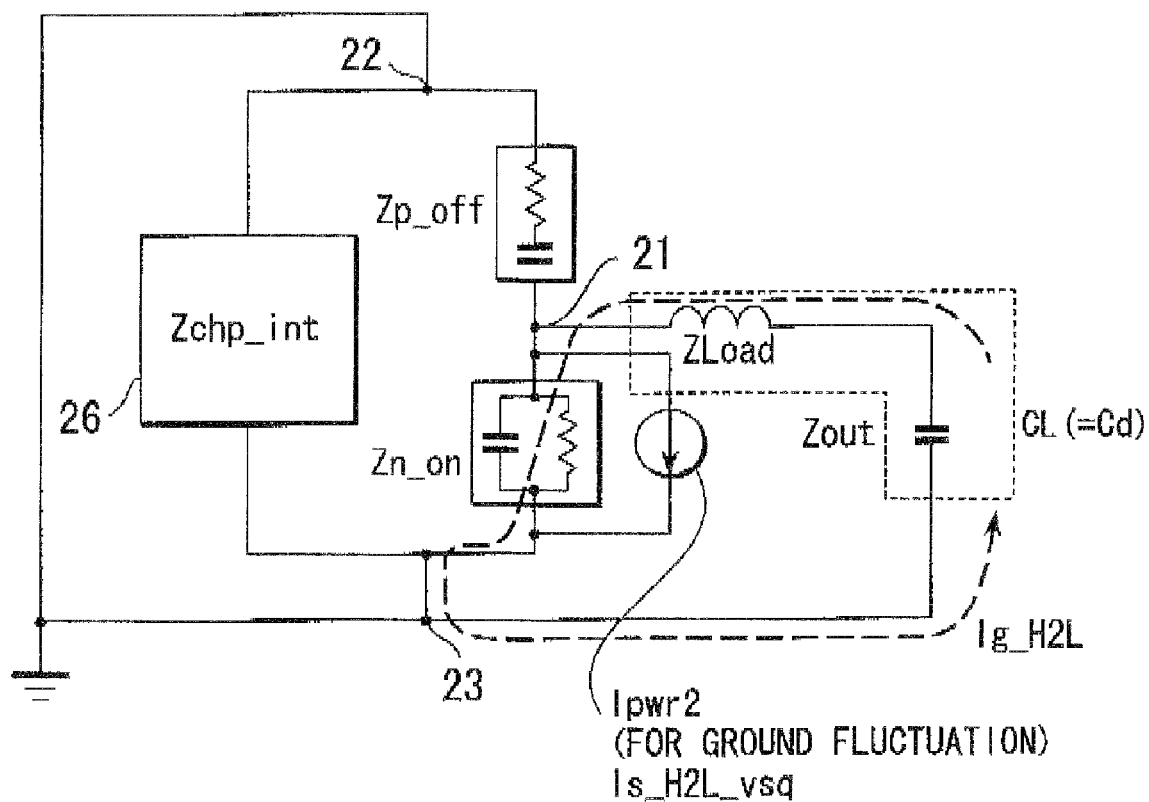
FIG. 14 is a view for use in describing how to calculate a second current source for ground voltage fluctuation spectrum calculation.

Likewise, in order to calculate the current source Ipwr2 for use in analysis of ground voltage fluctuation, the predetermined load model Zout is connected between the output pad 21 and the ground pad 23, as shown in FIG. 14. If the predetermined load model Zout is extremely smaller than the pMOS circuitry impedance $Z_{p\_off}$, a current Ig_H2L passing through the ground pad 23 in the second transition state (H->L) generally flows into the predetermined load model Zout and the nMOS circuitry impedance $Z_{n\_on}$. In this embodiment, the current Ig_H2L is represented in frequency domain and is obtained by carrying out a transient analysis with a SPICE model of the second semiconductor chip 20, followed by carrying out the Fourier transform for the result of the transient analysis. By using the current Ig_H2L, the current value Is_H2L_vsq of the current source Ipwr2 can be calculated from the following equation:

$$I_{\text{s\_H2L\_vsq}} = \frac{Z_{\text{n\_on}} + Z_{\text{p\_off}} // Z_{\text{load}}}{Z_{\text{n\_on}}} \times I_{\text{g\_H2L}} \quad (8)$$

Although the currents Iv_L2H, Ig_L2H, Iv_H2L and Ig_H2L are obtained by the transient analysis and the Fourier transform in this embodiment, they may be obtained by actual, direct measurements of the power supply pad 22 or the ground pad 23 by the use of a spectrum analyzer or an oscilloscope.

Turning back to FIG. 7, a first target variable is calculated from a combination of the target impedance model, the selected input circuit chip model and the first output circuit chip model, while a second target variable is calculated from a combination of the target impedance model, the selected input circuit chip model and the second output circuit chip model. In detail, loop equations are set up on the combination of the target impedance model, the selected input circuit chip model and the first output circuit chip model and are solved to obtain the first target variable. Likewise loop equations are set up on the combination of the target impedance model, the selected input circuit chip model and the second output circuit chip model and are solved to obtain the second target variable. Thus, the first and the second target variables can be obtained (S104).

Next, one of the first target variable and the second target variable is selected as a main target variable (S105). In this embodiment, the first target variable and the second target variable are compared with each other, and inferior one of the first target variable and the second target variable is selected as the main target variable, in consideration of power integrity for the second semiconductor chip 20.

In the present embodiment, a first constraint and a second constraint are prepared. Each of the first constraint and the second constraint is a voltage fluctuation spectrum represented in frequency domain. The first constraint and the second constraint are constraints of the first transition state and the second transition state, respectively. When the main target variable is decided, one of the first constraint and the second constraint is selected as a predetermined constraint in correspondence with the transition state of the main target variable (Step S106).

Next, the main target variable and the predetermined constraint are compared with each other (S107). As a result of the comparison, design guidelines are decided for the adjustment target (S108).

Figure 15:
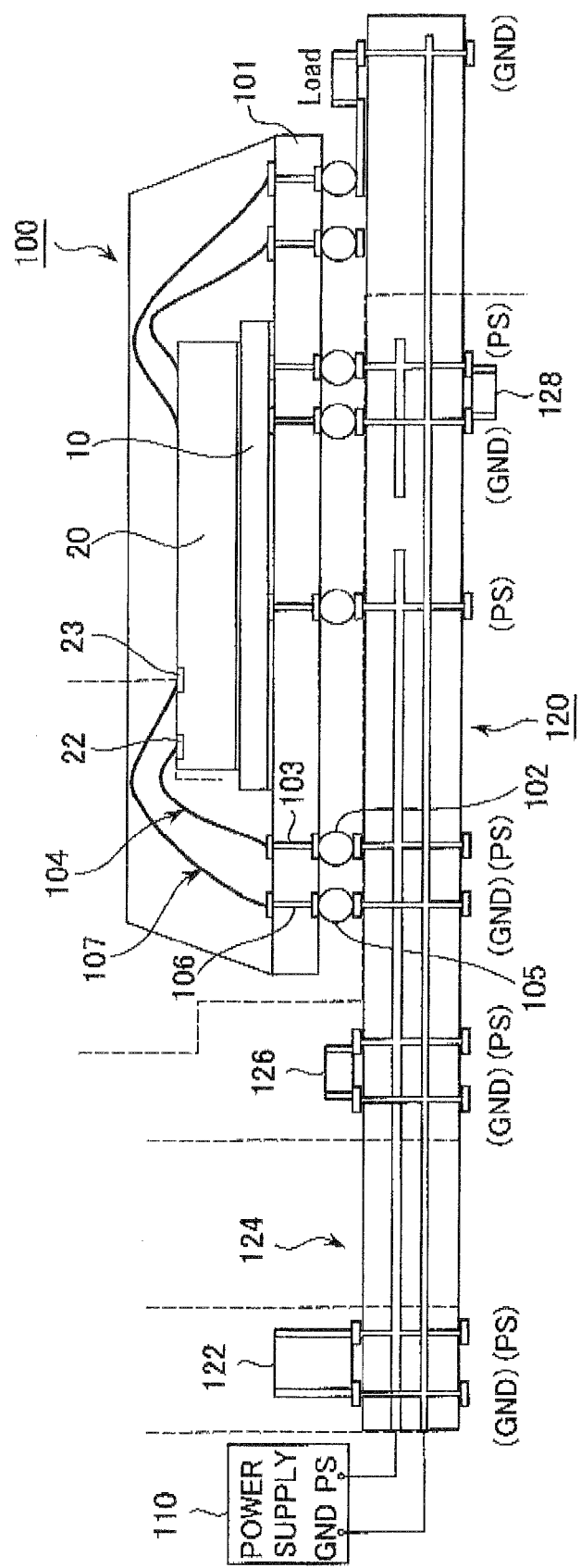
FIG. 15 is a view showing a semiconductor system to which an embodiment of the present invention is applicable.
Figure 16:
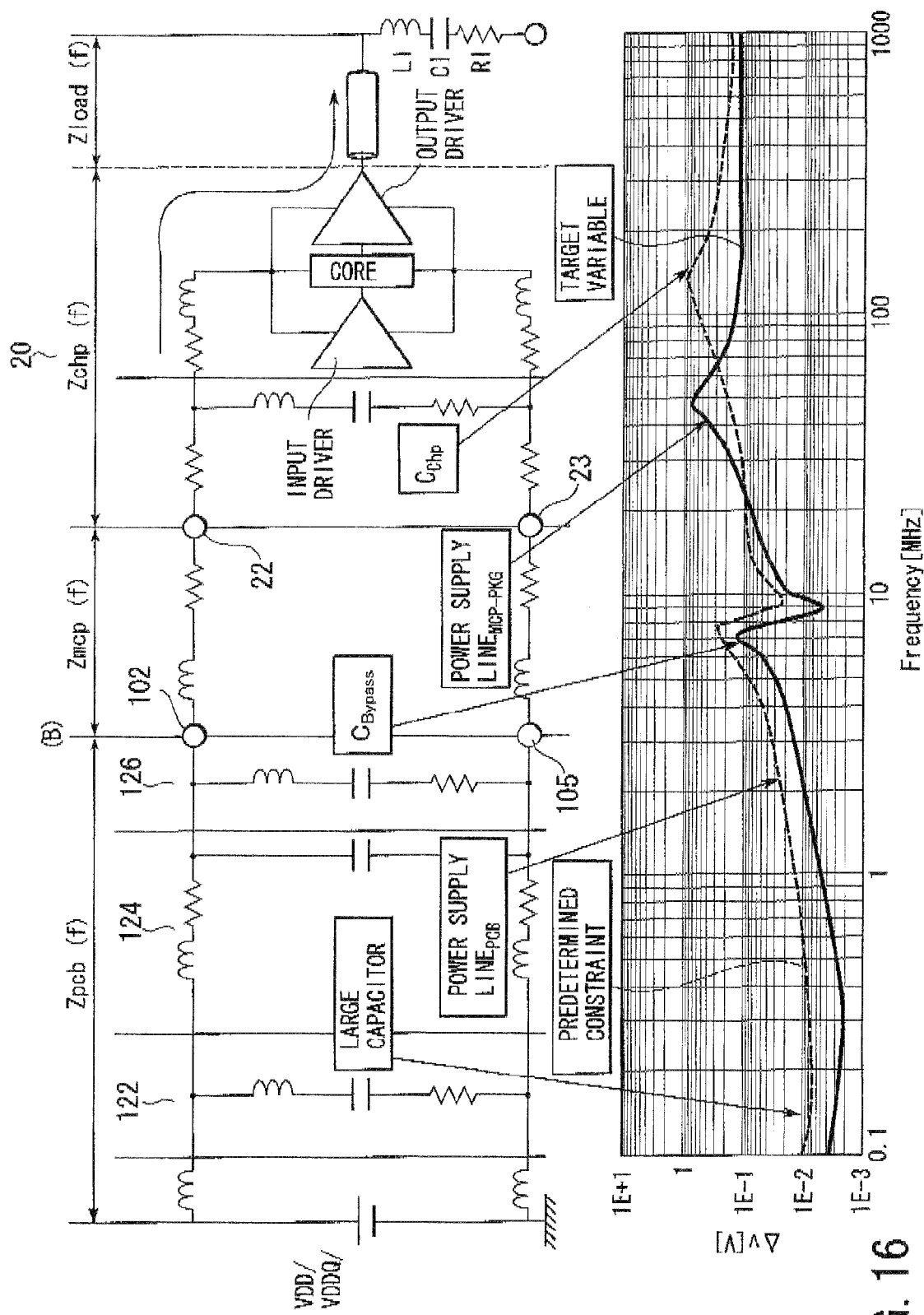
FIG. 16 is a view showing an analysis result of the semiconductor system of FIG. 24.

Now, a benefit of the comparison of the target variable and the constraint in frequency domain (S1107) is explained with further reference to FIGS. 15 and 16.

The illustrated device of FIG. 15 comprises a power supply unit 110, a printed circuit board (PCB) 120 and the multi-chip package (MCP) 100. The power supply unit 110 has a power supply portion (PS) and a ground portion (GND). The printed circuit board 120 comprises, as electrical components, a large capacitor 122, a power supply line 124, a bypass capacitor 126, and another bypass capacitor 128. The power supply line 124 is also referred to as a power supply pattern, a set of power supply traces, or a power supply plane. The bypass capacitor 126 is mounted on one surface of the printed circuit board 120, while the other bypass capacitor 128 is mounted the other surface of the printed circuit board 120. The multi-chip package 100 has a structure in which the first semiconductor chip 10 and the second semiconductor chip 20 are stacked on a package substrate 101. The second semiconductor chip 20 comprises the power supply pad 22 and the ground pad 23. The power supply pad 22 of the second semiconductor chip 20 is connected to a power supply terminal (ball) 102 through a through-hole 103, a power supply line (wire) 104, traces (not shown) and so on. The ground pad 23 of the second semiconductor chip 20 is connected to a ground terminal (ball) 105 through a through-hole 106, a ground line (wire) 107, traces (not shown) and so on. The power supply terminal 102 is electrically connected to the power supply portion of the power supply unit 110. The ground terminal 105 is electrically connected to the ground portion of the power supply unit 110.

In this modification, the through-hole 103, the power supply line 104, traces and so on constitute an electrical path electrically connecting between the power supply pad 22 and the power supply terminal 102, while the through-hole 106, the ground line 107, traces and so on constitute another electrical path electrically connecting between the ground pad 23 and the ground terminal 105, respectively.

As shown in an upper part of FIG. 16, every electrical element constituting the adjustment target can be represented as an R/L/C element. Therefore, each section of the above-mentioned electrical paths can be represented as a passive circuit block so that the impedance of each section can be represented as a function of frequency i.e. each section has a frequency-dependent impedance.

According to the above-mentioned comparison, a problematic section of the adjustment target can be easily identified as a section corresponding to a frequency region at which the main target variable exceeds the predetermined constraint, ex. a section "POWER SUPPLY LINE$_{MCP\text{-}PKG}$" in a lower part of FIG. 16. If the problematic section is identified, design guidelines is decided to solve the identified problematic section as shown in the step S108 of FIG. 7.

The design guidelines are, for example, the optimized impedance of at least one of the electrical paths, the optimized width, length and/or thickness of at least one trace of a pattern or a wire included in at least one of the electrical paths, a result of pass/fail (validity/invalidity of design) determination for at least one trace of a pattern or at least one wire included in at least one of the electrical paths, the optimized electrical length of at least one of the electrical paths, the optimized number of layers constituting a substrate of the device, the minimized width of at least one trace of a pattern included in at least one of the electrical paths if the target information relates to a length of the trace, and the maximized length of at least one trace of a pattern included in at least one of the electrical paths if the target information relates to a width of the trace. The design guidelines may include information about the identified problematic section as such, for example, the position thereof.

Figure 17:
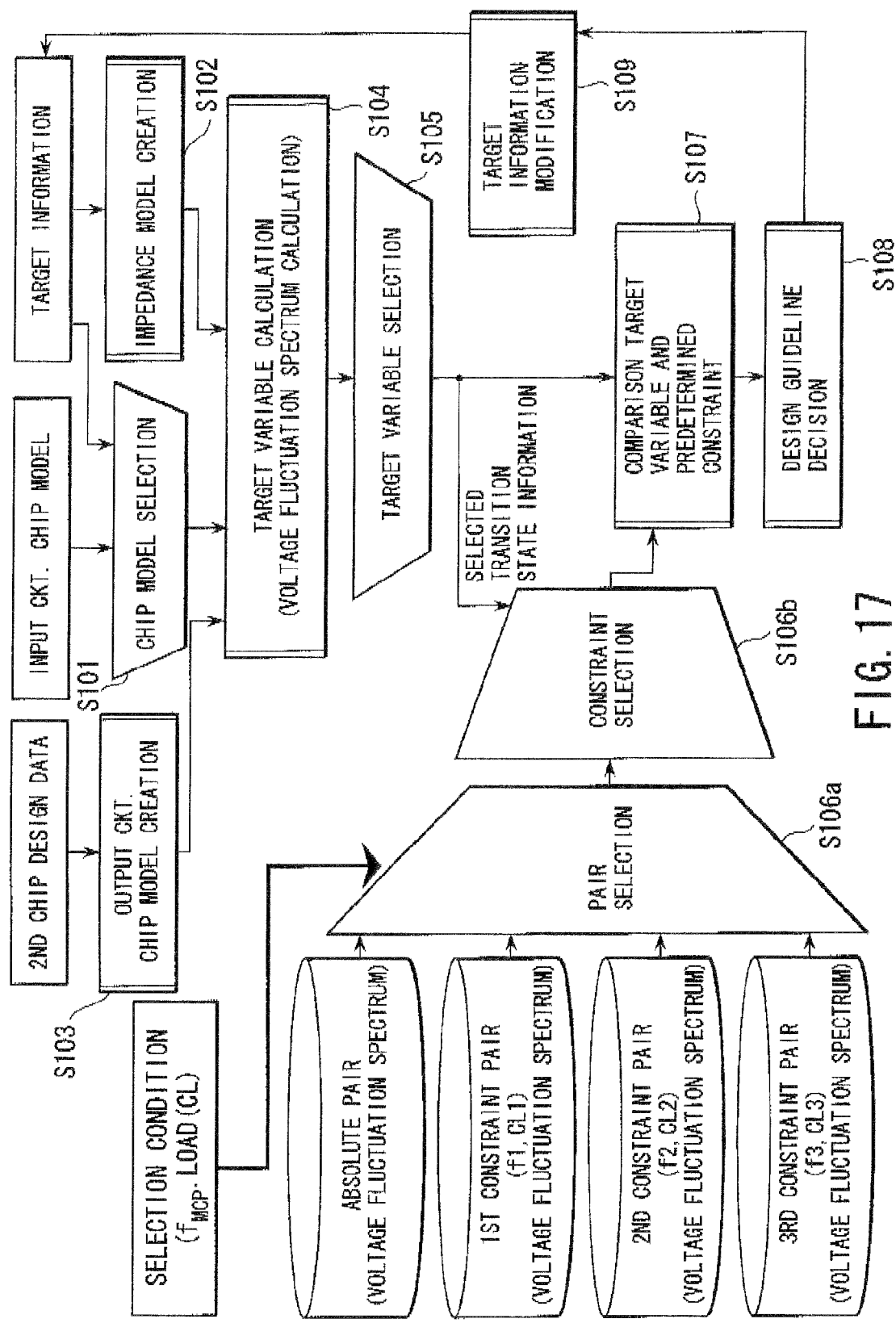
FIG. 17 is a flowchart showing a design method that is a modification of the method of FIG. 7.

The method of FIG. 7 may be modified as another method of FIG. 17; there are generally included two modifications.

One of the modifications is that only a single pair of first and second constraints is prepared in the method of FIG. 7, but a plurality pairs of first and second constraints are prepared in the method of FIG. 17. In detail, the constraint pairs including "ABSOLUTE" are prepared in advance from an already-validated semiconductor package in consideration of various operational conditions. One of the constraint pairs is selected in accordance with the selection condition (S106a in FIG. 17). In this embodiment, the selection condition comprises operational conditions such as operation frequency $f_{MCP}$ of the semiconductor package and its load CL. Note here that, among the constraint pairs, "ABSOLUTE" is a special constraint pair that does not relate to operational conditions and is selected when a selected condition clearly indicates the special constraint pair. After the pair selection, one of the first and the second constraints included in the selected pair is further selected in S106b of FIG. 17 in a manner similar to S106 of FIG. 7.

The other of the modifications is that the previously-used target information is modified (S109) in consideration of the design guidelines decided in S100 of FIG. 17; the modified target information is used in S101 and S102 of FIG. 17. The additional step S109 is useful for the case where the method of the present invention is implemented as a design aid system, i.e. for an automated processing.

The methods according to the above-described embodiments may be embodied, at least in part, as hardware logic in a circuit.

Alternatively, the above-described methods may be embodied, at least in part, as a software computer program product for use with a computer system. Such an implementation may comprise a series of computer readable instructions either fixed on a tangible medium, such as a computer readable medium, e.g., diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, e.g., shrink wrapped software, pre-loaded with a computer system, e.g., on a system ROM or fixed disk, or distributed from a server or electronic bulletin board over a network, e.g., the Internet or World Wide Web.

Figure 18:
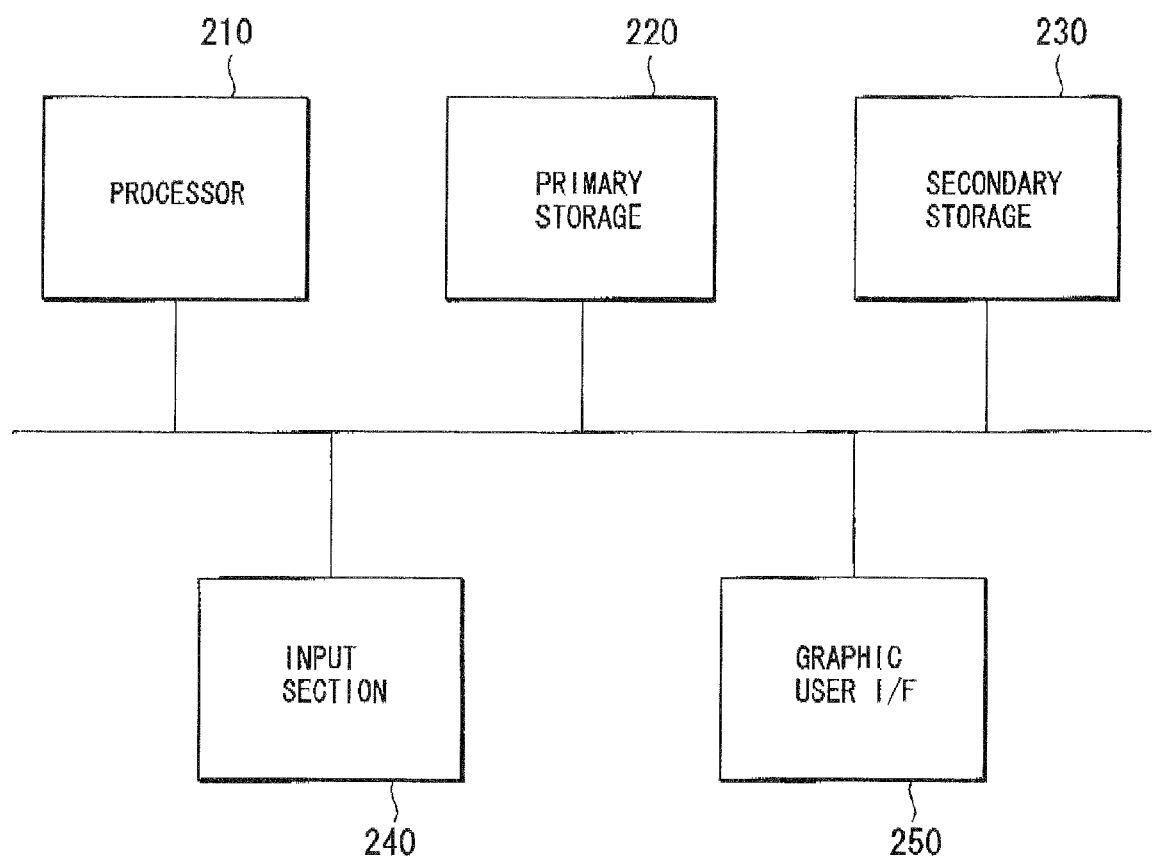
FIG. 18 is a block diagram showing a design aid system based on a method of an embodiment of the present invention.

With reference to FIG. 18, a system comprises a processor 210, a primary storage 220, a secondary storage 230, an input section 240 and a graphic user interface 250. The system may comprise various kinds of other computer components. The graphic user interface 250 is for example a display unit such as a cathode ray tube (CRT) display device, or a liquid crystal display (LCD) device. The secondary storage 230 is a hard disk drive in this embodiment and stores a computer program of the present embodiment. The primary storage 220 is a DRAM memory device in this embodiment. The computer program is loaded on the primary storage 220 and is executed by the processor 210 to cause the system to perform as a design aid system in accordance with one of the above-described methods. The primary storage serves as a temporal storage where the processor 210 stores temporal data during executing of the computer program. Taking a general-purpose computer system into consideration, the primary storage 220 and the secondary storage 230 are separated. However, the present invention is not limited thereto. The system may comprise a single storage instead of the primary storage 220 and the secondary storage 230.

In the design aid system as the implementation of the above-described methods the design guidelines may be shown by the graphic user interface 250.

The present application is based on Japanese patent applications of JP2006-250076 filed before the Japan Patent Office on Sep. 14, 2006, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A method for designing a device, the device comprising a first semiconductor chip, a second semiconductor chip and an adjustment target, the first semiconductor chip comprising an input pad, a first power supply pad and a first ground pad and serving as an input circuit, the second semiconductor chip comprising an output pad, a second power supply pad and a second ground pad and serving as an output circuit, the output pad being electrically coupled to the input pad, the adjustment target being connected to the first and the second semiconductor chips, the method comprising:

calculating using a computer a main target variable from an input circuit chip model, an output circuit chip model and a target impedance model, the input circuit chip model being created by representing the first semiconductor chip in frequency domain in consideration of first and second capacitor models and a chip internal capacitor model, the first capacitor model being between the input pad and the first power supply pad, the second capacitor model being between the input pad and the first ground pad, the chip internal capacitor model being between the first power supply pad and the first ground pad, the output circuit chip model being created by representing the second semiconductor chip in frequency domain, the target impedance model being assumed by representing the adjustment target in frequency domain; and comparing using the computer the main target variable and a predetermined constraint represented in frequency domain to decide design guidelines for the adjustment target.

2. The method according to claim 1, wherein the calculating the main target variable comprises selecting, as the input circuit chip model, any one of first and second input circuit chip models on the basis of target information about the adjustment target, the first input circuit chip model comprising all of the first and the second capacitor models and the chip internal capacitor model, the second input circuit chip model comprising a third capacitor model instead of the first and the second capacitor models and the chip internal capacitor model, the third capacitor model being between the input pad and the first ground pad and having a capacitance obtained by adding up capacitances of the first and the second capacitor models.

3. The method according to claim 2, wherein the device is a semiconductor package comprising the first and the second semiconductor chips and being mounted on a printed circuit board, the adjustment target comprising the printed circuit board and the semiconductor package except the first and the second semiconductor chips, wherein the selecting selects the second input circuit chip model if a portion between the first and the second power supply pads in the semiconductor package is assumed to electrically open and if another portion between the first and the second power supply pads in the printed circuit board is assumed to electrically open.

4. The method according to claim 1, wherein the calculating the main target variable uses, as the input circuit chip model, a model comprising a third capacitor model, the third capacitor model being between the input pad and the first ground pad and having a capacitance obtained by adding up capacitances of the first and the second capacitor models.

5. The method according to claim 4, wherein the capacitance of the third capacitor model is equal to a capacitance measured between the input pad and the first ground pad by means of probes.

6. The method according to claim 1, wherein the calculating the main target variable comprises:
  calculating a first target variable on the basis of a first output circuit chip model, the target impedance model and the input circuit chip model, the first output circuit chip model being created by representing the second semiconductor chip in frequency domain in consideration of a first transition state, the first transition state being a state where an output level of the second semiconductor chip changes from a low level to a high level;
  calculating a second target variable on the basis of a second output circuit chip model, the target impedance model and the input circuit chip model, the second output circuit chip model being created by representing the second semiconductor chip in frequency domain in consideration of a second transition state, the second transition state being a state where an output level of the second semiconductor chip changes from the high level to the low level;
  in consideration of power integrity for the semiconductor chip, selecting inferior one of the first and the second target variables as the main target variable.

7. The method according to claim 6, further comprising selecting one of first and second constraints as the predetermined constraint, the first constraint being assumed in consideration of the first transition state, the second constraint being assumed in consideration of the second transition state, the predetermined constraint being the first constraint when the first target variable is selected as the main target variable, the predetermined constraint being the second constraint when the second target variable is selected as the main target variable.

8. The method according to claim 6, wherein:
  the calculating the first target variable is carried out so that the first target variable is a power-supply/ground voltage spectrum in the first transition state; and
  the calculating the second target variable is carried out so that the second target variable is another power-supply/ground voltage spectrum in the second transition state.

9. The method according to claim 6, further comprising: creating the first and the second output circuit chip models on the basis of chip information about the second semiconductor chip; and assuming the target impedance model on the basis of target information about the adjustment target.

10. The method according to claim 9, wherein:
  the calculating the first target variable is carried out under a state where the first output circuit chip model is connected to the target impedance model; and
  the calculating the second target variable is carried out under a state where the second output circuit chip model is connected to the target impedance model.

11. The method according to claim 10, the second semiconductor chip further comprising a pMOS circuitry, an nMOS circuitry and an internal section, the pMOS circuitry being connected between the second power supply pad and the output pad, the nMOS circuitry being connected between the output pad and the second ground pad, the internal section being connected between the second power supply pad and the second ground pad, the internal section having an internal impedance, wherein the creating the first and the second chip models comprises:
  creating the first output circuit chip model by connecting a first pMOS circuitry impedance and a first current source in parallel between the second power supply pad and the output pad, by connecting a first nMOS circuitry impedance between the output pad and the second ground pad, and by connecting the internal impedance between the second power supply pad and the second ground pad, the first pMOS circuitry impedance being assumed as an impedance of the pMOS circuitry being on an ON state, the first nMOS circuitry impedance being obtained by representing the nMOS circuitry in impedance, the first current source being assumed on the basis of current fluctuation on the second power supply pad in the first transition state; and
  creating the second output circuit chip model by connecting a second pMOS circuitry impedance between the second power supply pad and the output pad, by connecting a second nMOS circuitry impedance and a second current source in parallel between the output pad and the second ground pad, and by connecting the internal impedance between the second power supply pad and the second ground pad, the second pMOS circuitry impedance being obtained by representing the pMOS circuitry in impedance, the second nMOS circuitry impedance being assumed as an impedance of the nMOS circuitry being on an ON state, the second current source being assumed on the basis of current fluctuation on the second ground pad in the second transition state.

12. The method according to claim 11, wherein:
the creating the first output circuit chip model comprises:
for analysis of voltage fluctuation on the second power supply pad, assuming as the first nMOS circuitry impedance an impedance of the nMOS circuitry being on an OFF state; and calculating the first current source on the basis of assumptions that a predetermined load model is connected between the output pad and the second ground pad, that a first power supply current flows through the second power supply pad in the first transition state, and that the first power supply current generally flows into the first pMOS circuitry impedance and the predetermined load model; and
for analysis of voltage fluctuation on the second ground pad, assuming as the first nMOS circuitry impedance an impedance of the nMOS circuitry being on an ON state; and calculating the first current source on the basis of assumptions that the predetermined load model is connected between the output pad and the second ground pad, that a first ground current flows through the second ground pad in the first transition state, and that the first ground current generally flows into the first pMOS circuitry impedance and the first nMOS circuitry impedance; and
the creating the second output circuit chip model comprises:
for analysis of voltage fluctuation on the second power supply pad, assuming as the second pMOS circuitry impedance an impedance of the pMOS circuitry being on an ON state; and calculating the second current source on the basis of assumptions that the predetermined load model is connected between the output pad and the second ground pad, that a second power supply current flows through the second power supply pad in the second transition state, and that the second power supply current generally flows into the second pMOS circuitry impedance and the second nMOS circuitry impedance; and for analysis of voltage fluctuation on the second ground pad, assuming as the second pMOS circuitry impedance an impedance of the pMOS circuitry being on an OFF state; and calculating the second current source on the basis of assumptions that the predetermined load model is connected between the output pad and the second ground pad, that a second ground current flows through the second ground pad in the second transition state, and that the second ground current generally flows into the predetermined load model and the second nMOS circuitry impedance.

13. The method according to claim 12, wherein the predetermined load model essentially consists of an inductance between the output pad and the input pad and a third capacitor model having a capacitance obtained by adding up capacitances of the first and the second capacitor models, the inductance and the third capacitor model being connected in series.

14. The method according to claim 6, wherein:
the calculating the first target variable comprises combining the target impedance model, the input circuit chip model and the first output circuit chip model, setting up a first loop equation on the combination of the target impedance model, the input circuit chip model and the first output circuit chip model, and solving the first loop equation to obtain the first target variable; and the calculating the second target variable comprises combining the target impedance model, the input circuit chip model and the second output circuit chip model, setting up a second loop equation on the combination of the target impedance model, the input circuit chip model and the second output circuit chip model, and solving the second loop equation to obtain the second target variable.

15. The method according to claim 1, wherein the comparing comprising:
identifying a problematic section of the adjustment target, the problematic section corresponding to a frequency region at which the main target variable exceeds the predetermined constraint; and
deciding design guidelines to solve the identified problematic section.

16. A system for designing a device, the device comprising a first semiconductor chip, a second semiconductor chip and an adjustment target, the first semiconductor chip comprising an input pad, a first power supply pad and a first ground pad and serving as an input circuit, the second semiconductor chip comprising an output pad, a second power supply pad and a second ground pad and serving as an output circuit, the output pad being electrically coupled to the input pad, the adjustment target being connected to the first and the second semiconductor chips, the system comprising:
a main target variable calculator configured to calculate a main target variable from an input circuit chip model, an output circuit chip model and a target impedance model, the input circuit chip model being created by representing the first semiconductor chip in frequency domain in consideration of first and second capacitor models and a chip internal capacitor model, the first capacitor model being between the input pad and the first power supply pad, the second capacitor model being between the input pad and the first ground pad, the chip internal capacitor model being between the first power supply pad and the first ground pad, the output circuit chip model being created by representing the second semiconductor chip in frequency domain, the target impedance model being assumed by representing the adjustment target in frequency domain; and
a comparator configured to compare the main target variable and a predetermined constraint represented in frequency domain to decide design guidelines for the adjustment target.

17. A system comprising a bus system, a processor connected to the bus system and a memory connected to the bus system, the memory storing a computer program that, when executed by the processor, causes the processor to perform predetermined operations to aid to design a device, the device comprising a first semiconductor chip, a second semiconductor chip and an adjustment target, the first semiconductor chip comprising an input pad, a first power supply pad and a first ground pad and serving as an input circuit, the second semiconductor chip comprising an output pad, a second power supply pad and a second ground pad and serving as an output circuit, the output pad being electrically coupled to the input pad, the adjustment target being connected to the first and the second semiconductor chips, the predetermined operations comprising:
calculating a main target variable from an input circuit chip model, an output circuit chip model and a target impedance model, the input circuit chip model being created by representing the first semiconductor chip in frequency domain in consideration of first and second capacitor models and a chip internal capacitor model, the first capacitor model being between the input pad and the first power supply pad, the second capacitor model being between the input pad and the first ground pad, the chip internal capacitor model being between the first power supply pad and the first ground pad, the output circuit chip model being created by representing the second semiconductor chip in frequency domain, the target impedance model being assumed by representing the adjustment target in frequency domain; and
comparing the main target variable and a predetermined constraint represented in frequency domain to decide design guidelines for the adjustment target.

18. The system according to claim 17, wherein the calculating the main target variable comprises selecting, as the input circuit chip model, any one of first and second input circuit chip models on the basis of target information about the adjustment target, the first input circuit chip model comprising all of the first and the second capacitor models and the chip internal capacitor model, the second input circuit chip model comprising a third capacitor model instead of the first and the second capacitor models and the chip internal capacitor model, the third capacitor model being between the input pad and the first ground pad and having a capacitance obtained by adding up capacitances of the first and the second capacitor models.

19. The system according to claim 18, a semiconductor package comprising the first and the second semiconductor chips and being mounted on a printed circuit board, the adjustment target comprising the printed circuit board and the semiconductor package except the first and the second semiconductor chips, wherein the selecting selects the second input circuit chip model if a portion between the first and the second power supply pads in the semiconductor package is assumed to electrically open and if another portion between the first and the second power supply pads in the printed circuit board is assumed to electrically open.

20. The system according to claim 17, wherein the calculating the main target variable uses, as the input circuit chip model, a model comprising a third capacitor model, the third capacitor model being between the input pad and the first ground pad and having a capacitance obtained by adding up capacitances of the first and the second capacitor models.

21. The system according to claim 20, wherein the capacitance of the third capacitor model is equal to a capacitance measured between the input pad and the first ground pad by means of probes.

22. The system according to claim 17, wherein the calculating the main target variable comprises:
  calculating a first target variable on the basis of a first output circuit chip model, the target impedance model and the input circuit chip model, the first output circuit chip model being created by representing the second semiconductor chip in frequency domain in consideration of a first transition state, the first transition state being a state where an output level of the second semiconductor chip changes from a low level to a high level;
  calculating a second target variable on the basis of a second output circuit chip model, the target impedance model and the input circuit chip model, the second output circuit chip model being created by representing the second semiconductor chip in frequency domain in consideration of a second transition state, the second transition state being a state where an output level of the second semiconductor chip changes from the high level to the low level;
  in consideration of power integrity for the semiconductor chip, selecting inferior one of the first and the second target variables as the main target variable.

23. The system according to claim 22, wherein:
  the predetermined operations further comprises selecting one of first and second constraints as the predetermined constraint, the first constraint being assumed in consideration of the first transition state, the second constraint being assumed in consideration of the second transition state, the predetermined constraint being the first constraint when the first target variable is selected as the main target variable, the predetermined constraint being the second constraint when the second target variable is selected as the main target variable.

24. The system according to claim 22, wherein:
  the calculating the first target variable is carried out so that the first target variable is a power-supply/ground voltage spectrum in the first transition state; and
  the calculating the second target variable is carried out so that the second target variable is another power-supply/ground voltage spectrum in the second transition state.

25. The system according to claim 22, wherein the predetermined operations further comprises:
  creating the first and the second output circuit chip models on the basis of chip information about the second semiconductor chip; and
  assuming the target impedance model on the basis of target information about the adjustment target.

26. The system according to claim 25, wherein:
  the calculating the first target variable is carried out under a state where the first output circuit chip model is connected to the target impedance model; and
  the calculating the second target variable is carried out under a state where the second output circuit chip model is connected to the target impedance model.

27. The system according to claim 26, the second semiconductor chip further comprising a pMOS circuitry, an nMOS circuitry and an internal section, the pMOS circuitry being connected between the second power supply pad and the output pad, the nMOS circuitry being connected between the output pad and the second ground pad, the internal section being connected between the second power supply pad and the second ground pad, the internal section having an internal impedance, wherein the creating the first and the second chip models comprises:
  creating the first output circuit chip model by connecting a first pMOS circuitry impedance and a first current source in parallel between the second power supply pad and the output pad, by connecting a first nMOS circuitry impedance between the output pad and the second ground pad, and by connecting the internal impedance between the second power supply pad and the second ground pad, the first pMOS circuitry impedance being assumed as an impedance of the pMOS circuitry being on an ON state, the first nMOS circuitry impedance being obtained by representing the nMOS circuitry in impedance, the first current source being assumed on the basis of current fluctuation on the second power supply pad in the first transition state; and
  creating the second output circuit chip model by connecting a second pMOS circuitry impedance between the second power supply pad and the output pad, by connecting a second nMOS circuitry impedance and a second current source in parallel between the output pad and the second ground pad, and by connecting the internal impedance between the second power supply pad and the second ground pad, the second pMOS circuitry impedance being obtained by representing the pMOS circuitry in impedance, the second nMOS circuitry impedance being assumed as an impedance of the nMOS circuitry being on an ON state, the second current source being assumed on the basis of current fluctuation on the second ground pad in the second transition state.

28. The system according to claim 27, wherein:
  the creating the first output circuit chip model comprises:
  for analysis of voltage fluctuation on the second power supply pad, assuming as the first nMOS circuitry impedance an impedance of the nMOS circuitry being on an OFF state; and
  calculating the first current source on the basis of assumptions that a predetermined load model is connected between the output pad and the second ground pad, that a first power supply current flows through the second power supply pad in the first transition state, and that the first power supply current generally flows into the first pMOS circuitry impedance and the predetermined load model; and
  for analysis of voltage fluctuation on the second ground pad, assuming as the first nMOS circuitry impedance an impedance of the nMOS circuitry being on an ON state; and calculating the first current source on the basis of assumptions that the predetermined load model is connected between the output pad and the second ground pad, that a first ground current flows through the second ground pad in the first transition state, and that the first ground current generally flows into the first pMOS circuitry impedance and the first nMOS circuitry impedance; and
  the creating the second output circuit chip model comprises:
  for analysis of voltage fluctuation on the second power supply pad, assuming as the second pMOS circuitry impedance an impedance of the pMOS circuitry being on an ON state; and calculating the second current source on the basis of assumptions that the predetermined load model is connected between the output pad and the second ground pad, that a second power supply current flows through the second power supply pad in the second transition state, and that the second power supply current generally flows into the second pMOS circuitry impedance and the second nMOS circuitry impedance; and for analysis of voltage fluctuation on the second ground pad, assuming as the second pMOS circuitry impedance an impedance of the pMOS circuitry being on an OFF state; and calculating the second current source on the basis of assumptions that the predetermined load model is connected between the output pad and the second ground pad, that a second ground current flows through the second ground pad in the second transition state, and that the second ground current generally flows into the predetermined load model and the second nMOS circuitry impedance.

29. The system according to claim 28, wherein the predetermined load model essentially consists of an inductance between the output pad and the input pad and a third capacitor model having a capacitance obtained by adding up capacitances of the first and the second capacitor models, the inductance and the third capacitor model being connected in series.

30. The system according to claim 22, wherein:
the calculating the first target variable comprises combining the target impedance model, the input circuit chip model and the first output circuit chip model, setting up a first loop equation on the combination of the target impedance model, the input circuit chip model and the first output circuit chip model, and solving the first loop equation to obtain the first target variable; and
the calculating the second target variable comprises combining the target impedance model, the input circuit chip model and the second output circuit chip model, setting up a second loop equation on the combination of the target impedance model, the input circuit chip model and the second output circuit chip model, and solving the second loop equation to obtain the second target variable.

31. The system according to claim 17, wherein the comparing comprising:
identifying a problematic section of the adjustment target, the problematic section corresponding to a frequency region at which the main target variable exceeds the predetermined constraint; and
deciding design guidelines to solve the identified problematic section.

32. A computer program product in a computer readable medium for use in a system for aiding to design a device, the device comprising a first semiconductor chip, a second semiconductor chip and an adjustment target, the first semiconductor chip comprising an input pad, a first power supply pad and a first ground pad and serving as an input circuit, the second semiconductor chip comprising an output pad, a second power supply pad and a second ground pad and serving as an output circuit, the output pad being electrically coupled to the input pad, the adjustment target being connected to the first and the second semiconductor chips, the computer program product comprising:
instructions for calculating a main target variable from an input circuit chip model, an output circuit chip model and a target impedance model, the input circuit chip model being created by representing the first semiconductor chip in frequency domain in consideration of first and second capacitor models and a chip internal capacitor model, the first capacitor model being between the input pad and the first power supply pad, the second capacitor model being between the input pad and the first ground pad, the chip internal capacitor model being between the first power supply pad and the first ground pad, the output circuit chip model being created by representing the second semiconductor chip in frequency domain, the target impedance model being assumed by representing the adjustment target in frequency domain; and
instructions for comparing the main target variable and a predetermined constraint represented in frequency domain to decide design guidelines for the adjustment target.

33. The computer program product according to claim 32, wherein the instructions for calculating the main target variable comprises selecting, as the input circuit chip model, any one of first and second input circuit chip models on the basis of target information about the adjustment target, the first input circuit chip model comprising all of the first and the second capacitor models and the chip internal capacitor model, the second input circuit chip model comprising a third capacitor model instead of the first and the second capacitor models and the chip internal capacitor model, the third capacitor model being between the input pad and the first ground pad and having a capacitance obtained by adding up capacitances of the first and the second capacitor models.

34. The computer program product according to claim 33, a semiconductor package comprising the first and the second semiconductor chips and being mounted on a printed circuit board, the adjustment target comprising the printed circuit board and the semiconductor package except the first and the second semiconductor chips, wherein the instructions for selecting selects the second input circuit chip model if a portion between the first and the second power supply pads in the semiconductor package is assumed to electrically open and if another portion between the first and the second power supply pads in the printed circuit board is assumed to electrically open.

35. The computer program product according to claim 32, wherein the instructions for calculating the main target variable uses, as the input circuit chip model, a model comprising a third capacitor model, the third capacitor model being between the input pad and the first ground pad and having a capacitance obtained by adding up capacitances of the first and the second capacitor models.

36. The computer program product according to claim 35, wherein the capacitance of the third capacitor model is equal to a capacitance measured between the input pad and the first ground pad by means of probes.

37. The computer program product according to claim 32, wherein the instructions for calculating the main target variable comprises:
instructions for calculating a first target variable on the basis of a first output circuit chip model, the target impedance model and the input circuit chip model, the first output circuit chip model being created by representing the second semiconductor chip in frequency domain in consideration of a first transition state, the first transition state being a state where an output level of the second semiconductor chip changes from a low level to a high level;
instructions for calculating a second target variable on the basis of a second output circuit chip model, the target impedance model and the input circuit chip model, the second output circuit chip model being created by representing the second semiconductor chip in frequency domain in consideration of a second transition state, the second transition state being a state where an output level of the second semiconductor chip changes from the high level to the low level;

in consideration of power integrity for the semiconductor chip, instructions for selecting inferior one of the first and the second target variables as the main target variable.

38. The computer program product according to claim 37, further comprising instructions for selecting one of first and second constraints as the predetermined constraint, the first constraint being assumed in consideration of the first transition state, the second constraint being assumed in consideration of the second transition state, the predetermined constraint being the first constraint when the first target variable is selected as the main target variable, the predetermined constraint being the second constraint when the second target variable is selected as the main target variable.

39. The computer program product according to claim 37, wherein:

the instructions for calculating the first target variable is carried out so that the first target variable is a power-supply/ground voltage spectrum in the first transition state; and the instructions for calculating the second target variable is carried out so that the second target variable is another power-supply/ground voltage spectrum in the second transition state.

40. The computer program product according to claim 37, further comprising: instructions for creating the first and the second output circuit chip models on the basis of chip information about the second semiconductor chip; and instructions for assuming the target impedance model on the basis of target information about the adjustment target.

41. The computer program product according to claim 40, wherein:

the instructions for calculating the first target variable is carried out under a state where the first output circuit chip model is connected to the target impedance model; and the instructions for calculating the second target variable is carried out under a state where the second output circuit chip model is connected to the target impedance model.

42. The computer program product according to claim 41, the second semiconductor chip further comprising a pMOS circuitry, an nMOS circuitry and an internal section, the pMOS circuitry being connected between the second power supply pad and the output pad, the nMOS circuitry being connected between the output pad and the second ground pad, the internal section being connected between the second power supply pad and the second ground pad, the internal section having an internal impedance, wherein the instructions for creating the first and the second chip models comprises:

instructions for creating the first output circuit chip model by connecting a first pMOS circuitry impedance and a first current source in parallel between the second power supply pad and the output pad, by connecting a first nMOS circuitry impedance between the output pad and the second ground pad, and by connecting the internal impedance between the second power supply pad and the second ground pad, the first pMOS circuitry impedance being assumed as an impedance of the pMOS circuitry being on an ON state, the first nMOS circuitry impedance being obtained by representing the nMOS circuitry in impedance, the first current source being assumed on the basis of current fluctuation on the second power supply pad in the first transition state; and instructions for creating the second output circuit chip model by connecting a second pMOS circuitry impedance between the second power supply pad and the output pad, by connecting a second nMOS circuitry impedance and a second current source in parallel between the output pad and the second ground pad, and by connecting the internal impedance between the second power supply pad and the second ground pad, the second pMOS circuitry impedance being obtained by representing the pMOS circuitry in impedance, the second nMOS circuitry impedance being assumed as an impedance of the nMOS circuitry being on an ON state, the second current source being assumed on the basis of current fluctuation on the second ground pad in the second transition state.

43. The computer program product according to claim 42, wherein:

the instructions for creating the first output circuit chip model comprises:

for analysis of voltage fluctuation on the second power supply pad, instructions for assuming as the first nMOS circuitry impedance an impedance of the nMOS circuitry being on an OFF state; and instructions for calculating the first current source on the basis of assumptions that a predetermined load model is connected between the output pad and the second ground pad, that a first power supply current flows through the second power supply pad in the first transition state, and that the first power supply current generally flows into the first pMOS circuitry impedance and the predetermined load model; and for analysis of voltage fluctuation on the second ground pad, instructions for assuming as the first nMOS circuitry impedance an impedance of the nMOS circuitry being on an ON state; and instructions for calculating the first current source on the basis of assumptions that the predetermined load model is connected between the output pad and the second ground pad, that a first ground current flows through the second ground pad in the first transition state, and that the first ground current generally flows into the first pMOS circuitry impedance and the first nMOS circuitry impedance; and the creating the second output circuit chip model comprises:

for analysis of voltage fluctuation on the second power supply pad, instructions for assuming as the second pMOS circuitry impedance an impedance of the pMOS circuitry being on an ON state; and instructions for calculating the second current source on the basis of assumptions that the predetermined load model is connected between the output pad and the second ground pad, that a second power supply current flows through the second power supply pad in the second transition state, and that the second power supply current generally flows into the second pMOS circuitry impedance and the second nMOS circuitry impedance; and for analysis of voltage fluctuation on the second ground pad, instructions for assuming as the second pMOS circuitry impedance an impedance of the pMOS circuitry being on an OFF state; and instructions for calculating the second current source on the basis of assumptions that the predetermined load model is connected between the output pad and the second ground pad, that a second ground current flows through the second ground pad in the second transition state, and that the second ground current generally flows into the predetermined load model and the second nMOS circuitry impedance.

44. The computer program product according to claim 43, wherein the predetermined load model essentially consists of an inductance between the output pad and the input pad and a third capacitor model having a capacitance obtained by adding up capacitances of the first and the second capacitor models, the inductance and the third capacitor model being connected in series.

45. The computer program product according to claim 43, the instructions for creating the first output circuit chip model comprises:

for analysis of voltage fluctuation on the second power supply pad, instructions for carrying out an transient analysis on a SPICE model for the second semiconductor chip in accordance with the first transition state to obtain a first current waveform and instructions for carrying out the Fourier transform for the first current waveform to obtain a spectrum of a current flowing through the second power supply pad in the first transition state; and for analysis of voltage fluctuation on the second ground pad, instructions for carrying out an transient analysis on a SPICE model for the second semiconductor chip in accordance with the first transition state to obtain a first current waveform and instructions for carrying out the Fourier transform for the first current waveform to obtain a spectrum of a current flowing through the second ground pad in the first transition state; and the instructions for creating the second output circuit chip model comprises:

for analysis of voltage fluctuation on the second power supply pad, instructions for carrying out an transient analysis on a SPICE model for the second semiconductor chip in accordance with the second transition state to obtain a second current waveform and instructions for carrying out the Fourier transform for the second current waveform to obtain a spectrum of a current flowing through the second power supply pad in the second transition state; and for analysis of voltage fluctuation on the ground pad, instructions for carrying out an transient analysis on a SPICE model for the second semiconductor chip in accordance with the second transition state to obtain a second current waveform and instructions for carrying out the Fourier transform for the second current waveform to obtain a spectrum of a current flowing through the second ground pad in the second transition state.

46. The computer program product according to claim 37, wherein:

the calculating the first target variable comprises combining the target impedance model, the input circuit chip model and the first output circuit chip model, setting up a first loop equation on the combination of the target impedance model, the input circuit chip model and the first output circuit chip model, and solving the first loop equation to obtain the first target variable; and the calculating the second target variable comprises combining the target impedance model, the input circuit chip model and the second output circuit chip model, setting up a second loop equation on the combination of the target impedance model, the input circuit chip model and the second output circuit chip model, and solving the second loop equation to obtain the second target variable.

47. The computer program product according to claim 32, wherein the comparing comprising:

identifying a problematic section of the adjustment target, the problematic section corresponding to a frequency region at which the main target variable exceeds the predetermined constraint; and deciding design guidelines to solve the identified problematic section.

* * * * *